(12) United States Patent  
Arai

(10) Patent No.: US 10,170,630 B2  
(45) Date of Patent: Jan. 1, 2019

(54) MANUFACTURING METHOD OF SEMICONDUCTOR MEMORY DEVICE

(71) Applicant: SEMICONDUCTOR ENERGY LABORATORY CO., LTD., Atsugi-shi, Kanagawa-ken (JP)

(72) Inventor: Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/735,687

(22) Filed: Jun. 10, 2015

(65) Prior Publication Data

US 2015/0357473 A1 Dec. 10, 2015

Related U.S. Application Data

(63) Continuation of application No. 13/782,704, filed on Mar. 1, 2013, now Pat. No. 9,059,029.

(30) Foreign Application Priority Data

Mar. 5, 2012 (JP) .................................. 2012-048244

(51) Int. Cl.
*H01L 21/8239* (2006.01)
*H01L 29/786* (2006.01)
(Continued)

(52) U.S. Cl.
CPC ...... *H01L 29/7869* (2013.01); *H01L 21/8239* (2013.01); *H01L 27/108* (2013.01);
(Continued)

(58) Field of Classification Search
CPC ............. H01L 21/8239; H01L 27/108; H01L 27/10832; H01L 27/10835; H01L 27/10847
See application file for complete search history.

(56) References Cited

U.S. PATENT DOCUMENTS 4,466,081 A 8/1984 Masuoka  
4,777,625 A 10/1988 Sakui et al.  
(Continued)

FOREIGN PATENT DOCUMENTS

EP 1737044 A 12/2006  
EP 2226847 A 9/2010  
JP 57-105889 A 7/1982  
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Phat X Cao  
(74) *Attorney, Agent, or Firm* — Fish & Richardson P.C.

(57) ABSTRACT

To provide a highly integrated semiconductor memory device. To provide a semiconductor memory device which can hold stored data even when power is not supplied. To provide a semiconductor memory device which has a large number of write cycles. The degree of integration of a memory cell array is increased by forming a memory cell including two transistors and one capacitor which are arranged three-dimensionally. The electric charge accumulated in the capacitor is prevented from being leaking by forming a transistor for controlling the amount of electric charge of the capacitor in the memory cell using a wide-gap semiconductor having a wider band gap than silicon. Accordingly, a semiconductor memory device which can hold stored data even when power is not supplied can be provided.

10 Claims, 19 Drawing Sheets

(51) Int. Cl.
  *H01L 27/108* (2006.01)
  *H01L 29/66* (2006.01)
  *H01L 29/423* (2006.01)
  *H01L 27/1156* (2017.01)

(52) U.S. Cl.
  CPC .. *H01L 27/10832* (2013.01); *H01L 27/10835* (2013.01); *H01L 27/1156* (2013.01); *H01L 29/42392* (2013.01); *H01L 29/66742* (2013.01); *H01L 29/78696* (2013.01)

(56) References Cited

U.S. PATENT DOCUMENTS

| | | | |
|---|---|---|---|
| 4,920,391 | A | 4/1990 | Uchida |
| 4,937,641 | A * | 6/1990 | Sunami ............ H01L 27/10841 257/302 |
| 4,982,372 | A | 1/1991 | Matsuo |
| 5,136,534 | A * | 8/1992 | McDavid ............... G11C 11/22 257/295 |
| 5,302,843 | A | 4/1994 | Yamazaki |
| 5,416,350 | A | 5/1995 | Watanabe |
| 5,627,390 | A | 5/1997 | Maeda et al. |
| 5,731,856 | A | 3/1998 | Kim et al. |
| 5,744,864 | A | 4/1998 | Cillessen et al. |
| 5,780,888 | A | 7/1998 | Maeda et al. |
| 5,888,868 | A | 3/1999 | Yamazaki et al. |
| 5,977,589 | A | 11/1999 | Schloesser et al. |
| 6,150,688 | A | 11/2000 | Maeda et al. |
| 6,246,083 | B1 | 6/2001 | Noble |
| 6,294,274 | B1 | 9/2001 | Kawazoe et al. |
| 6,303,425 | B1 | 10/2001 | Maeda et al. |
| 6,383,860 | B2 | 5/2002 | Maeda et al. |
| 6,501,116 | B2 | 12/2002 | Kisu et al. |
| 6,504,755 | B1 | 1/2003 | Katayama et al. |
| 6,509,217 | B1 | 1/2003 | Reddy |
| 6,512,714 | B2 | 1/2003 | Hanzawa et al. |
| 6,563,174 | B2 | 5/2003 | Kawasaki et al. |
| 6,574,148 | B2 | 6/2003 | Chevallier |
| 6,577,530 | B2 | 6/2003 | Muranaka et al. |
| 6,683,813 | B2 | 1/2004 | Hanzawa et al. |
| 6,727,522 | B1 | 4/2004 | Kawasaki et al. |
| 6,744,087 | B2 | 6/2004 | Misewich et al. |
| 6,751,142 | B2 | 6/2004 | Hanzawa et al. |
| 6,787,411 | B2 | 9/2004 | Kisu et al. |
| 6,873,009 | B2 | 3/2005 | Hisamoto et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,088,603 | B2 | 8/2006 | Patel |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,286,108 | B2 | 10/2007 | Tsuda et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,468,901 | B2 | 12/2008 | Kameshiro et al. |
| 7,501,293 | B2 | 3/2009 | Ito et al. |
| 7,550,334 | B2 | 6/2009 | Kato et al. |
| 7,601,595 | B2 | 10/2009 | Forbes |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,772,053 | B2 | 8/2010 | Kameshiro et al. |
| 8,148,215 | B2 | 4/2012 | Kato et al. |
| 8,437,165 | B2 | 5/2013 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0262681 | A1 | 12/2004 | Masuoka et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0266925 | A1 | 10/2008 | Lukes et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092805 | A1 | 4/2010 | Itagaki et al. |
| 2010/0109002 | A1 | 5/2010 | Itagaki et al. |
| 2010/0148171 | A1 | 6/2010 | Hayashi et al. |
| 2010/0290262 | A1 | 11/2010 | Scheuerlein et al. |
| 2011/0089417 | A1 | 4/2011 | Yamazaki et al. |
| 2011/0089419 | A1 | 4/2011 | Yamazaki et al. |
| 2011/0089927 | A1 | 4/2011 | Yamazaki et al. |
| 2011/0101334 | A1 | 5/2011 | Yamazaki et al. |

(56) References Cited

U.S. PATENT DOCUMENTS

| | | |
|---|---|---|
| 2011/0101337 A1 | 5/2011 | Yamazaki |
| 2011/0101351 A1 | 5/2011 | Yamazaki |
| 2011/0101356 A1 | 5/2011 | Yamazaki |
| 2011/0114946 A1 | 5/2011 | Saito |
| 2011/0121284 A1 | 5/2011 | Yamazaki et al. |
| 2011/0121288 A1 | 5/2011 | Yamazaki et al. |
| 2011/0121383 A1 | 5/2011 | Forbes |
| 2011/0121878 A1 | 5/2011 | Kato et al. |
| 2011/0122673 A1 | 5/2011 | Kamata et al. |
| 2011/0127522 A1 | 6/2011 | Yamazaki |
| 2011/0127526 A1 | 6/2011 | Kawae et al. |
| 2011/0134683 A1 | 6/2011 | Yamazaki et al. |
| 2011/0147737 A1 | 6/2011 | Yamazaki et al. |
| 2011/0175646 A1 | 7/2011 | Takemura et al. |
| 2011/0205774 A1 | 8/2011 | Takemura |
| 2011/0227062 A1 | 9/2011 | Kato et al. |
| 2011/0233555 A1 | 9/2011 | Endo |
| 2012/0001271 A1* | 1/2012 | Chae ............... H01L 29/4238 257/401 |
| 2012/0037972 A1 | 2/2012 | Yoneda |
| 2012/0043542 A1 | 2/2012 | Yanagisawa |
| 2012/0193697 A1 | 8/2012 | Takemura |
| 2012/0195104 A1 | 8/2012 | Takemura |
| 2012/0199842 A1 | 8/2012 | Takemura |
| 2012/0213000 A1 | 8/2012 | Takemura |
| 2012/0228688 A1 | 9/2012 | Matsubayashi |
| 2012/0236634 A1 | 9/2012 | Matsubayashi |
| 2013/0069052 A1 | 3/2013 | Sandhu |
| 2013/0221356 A1 | 8/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 A | 12/1988 |
| JP | 01-255269 A | 10/1989 |
| JP | 02-054572 A | 2/1990 |
| JP | 05-029571 A | 2/1993 |
| JP | 05-251705 A | 9/1993 |
| JP | 06-268173 A | 9/1994 |
| JP | 07-321228 A | 12/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-028443 A | 1/2001 |
| JP | 2001-203277 A | 7/2001 |
| JP | 2001-312253 A | 11/2001 |
| JP | 2002-076356 A | 3/2002 |
| JP | 2002-198499 A | 7/2002 |
| JP | 2002-203913 A | 7/2002 |
| JP | 2002-245775 A | 8/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-356314 A | 12/2004 |
| JP | 2011-204347 A | 10/2011 |
| JP | 2011-216878 A | 10/2011 |
| WO | WO-2004/114391 | 12/2004 |
| WO | WO-2011/108475 | 9/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

(56) References Cited

OTHER PUBLICATIONS

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

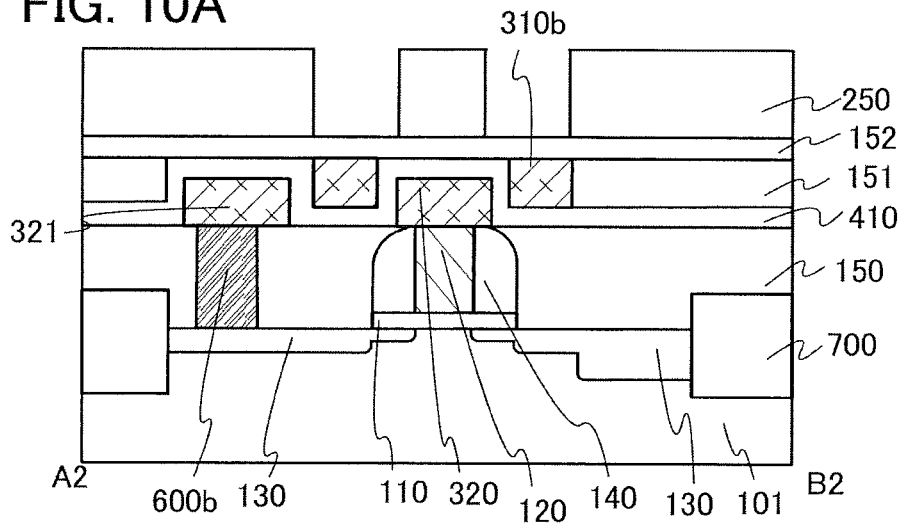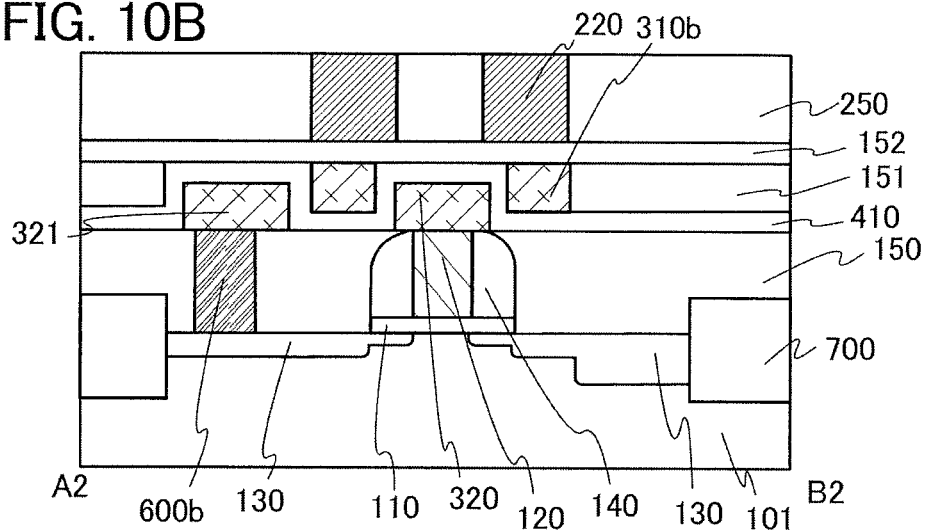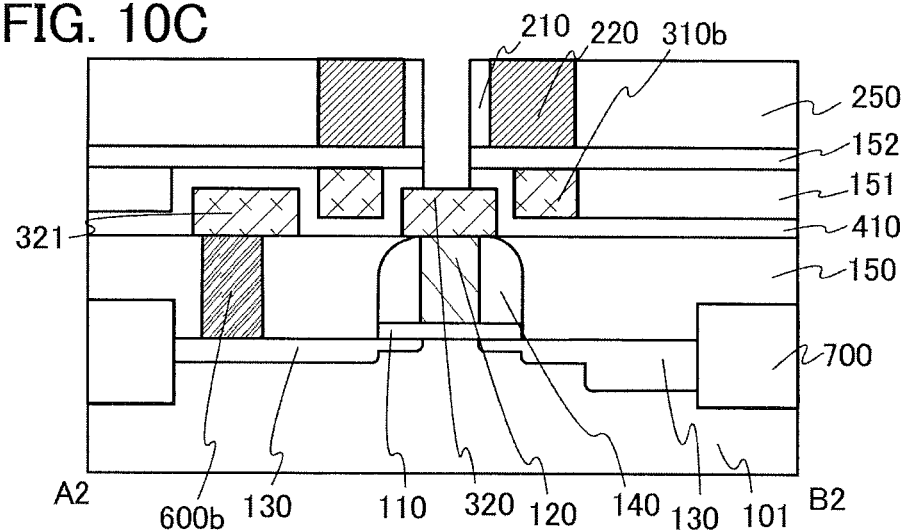

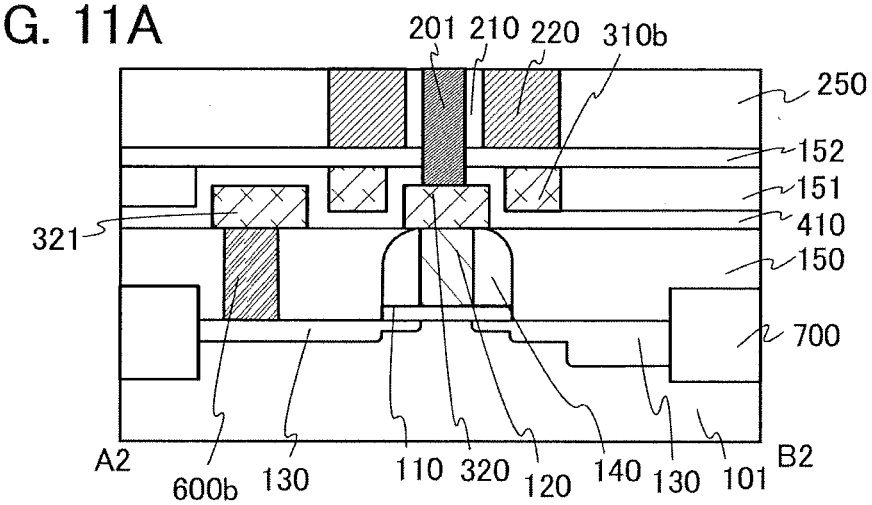
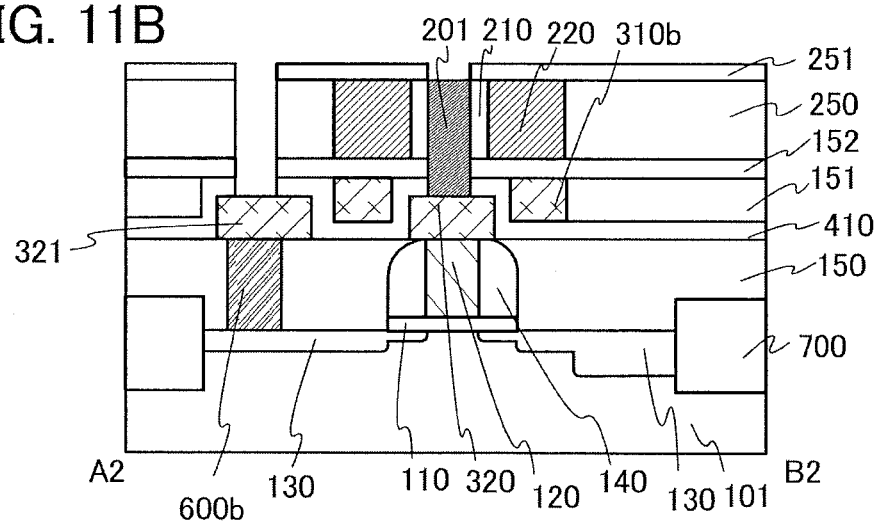
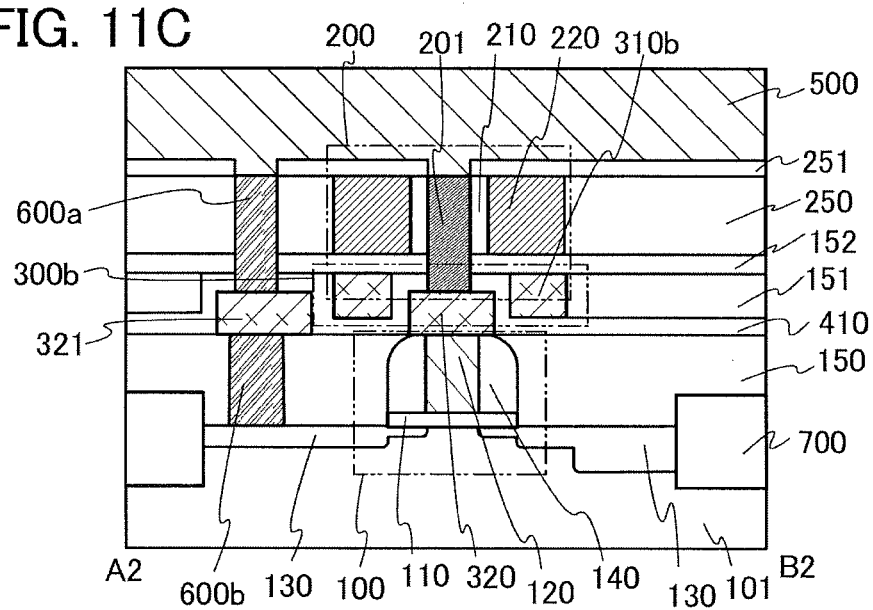

- ● In
- ☾ Sn
- ☽ Zn
- ● O

- In
- Ga
- Zn
- O

● In
◐ Ga or Zn
● O

● In
◐ Ga
◐ Zn
● O

MANUFACTURING METHOD OF SEMICONDUCTOR MEMORY DEVICE

CROSS-REFERENCE TO RELATED APPLICATIONS

This application is a continuation of U.S. application Ser. No. 13/782,704, filed Mar. 1, 2013, now allowed, which claims the benefit of a foreign priority application filed in Japan as Serial No. 2012-048244 on Mar. 5, 2012, both of which are incorporated by reference.

BACKGROUND OF THE INVENTION

1. Field of the Invention

The present invention relates to a semiconductor memory device.

2. Description of the Related Art

As semiconductor memory devices are integrated, a need for reduction of the area occupied by semiconductor elements arises. For example, in order to increase the degree of integration of a transistor, which is one of semiconductor elements, a so-called vertical transistor in which a channel is formed vertically to a substrate is known. When this structure is applied, a source electrode or a drain electrode overlaps with an active layer in which a channel is formed, so that the area occupied by the transistor can be reduced (for example, see Patent Document 1). As a result, a semiconductor memory device including such transistors can be integrated.

Semiconductor memory devices are classified into volatile semiconductor memory devices that lose stored data when power supply stops, and non-volatile semiconductor memories that hold stored data even when power supply stops.

Typical examples of volatile semiconductor memory devices are dynamic random access memories (DRAMs) and static random access memories (SRAMs). Such volatile memory devices lose stored data when supply of power is stopped, but consume relatively less power because they do not need high voltage as in non-volatile memories.

As a typical example of volatile semiconductor memory devices, a floating gate memory can be given. A floating gate memory includes a floating gate between a gate electrode and a channel formation region in a transistor and stores data by holding electric charge in the floating gate. Therefore, a flash memory has advantages in that the data holding period is extremely long (semi-permanent) and refresh operation which is necessary in a volatile memory device is not needed (for example, see Patent Document 2).

However, a gate insulating layer included in a memory element deteriorates by tunneling current generated in writing, so that the memory element stops its function after a predetermined number of writing operations. To reduce adverse effects of this problem, a method in which the number of writing operations for memory elements is equalized is employed, for example. However, a complex peripheral circuit is needed to realize this method. Moreover, employing such a method does not solve the fundamental problem of lifetime. In other words, a floating gate memory is not suitable for applications in which data is frequently rewritten.

To mend such problems of a floating gate memory, a semiconductor memory device which includes a memory cell including two transistors and one capacitor is proposed (Patent Document 3). The semiconductor memory device of the disclosed invention includes a capacitor over a gate electrode of a first transistor, and a second transistor for injecting or removing electric charge to/from the capacitor. The second transistor is formed using a material with which the off-state current of the transistor can be sufficiently small, for example, an oxide semiconductor material, which is a wide-gap semiconductor. Since the off-state current of the second transistor is sufficiently small, electric charge in the capacitor is not lost for a long period. Thus, the semiconductor memory device can hold data for a long period.

The semiconductor memory device has no problems with a function of holding data. However, there is a need for further integration of such a semiconductor memory device.

REFERENCE

[Patent Documents]
[Patent Document 1] Japanese Published Patent Application No. 2004-356314
[Patent Document 2] Japanese Published Patent Application No. S57-105889
[Patent Document 3] Japanese Published Patent Application No. 2011-216878

SUMMARY OF THE INVENTION

In view of the above problems, it is an object of one embodiment of the disclosed invention to provide a semiconductor memory device having a high degree of integration. Further, it is another object of one embodiment of the disclosed invention to provide a semiconductor memory device which can hold stored data even when power is not supplied. Still further, it is another object of one embodiment of the disclosed invention to provide a semiconductor memory device which has a large number of write cycles.

In a semiconductor memory device of one embodiment of the present invention, a memory cell includes two transistors and one capacitor which are arranged three-dimensionally. By three-dimensionally arranging the transistors and the capacitor, which are included in the memory cell, the cell density per unit area of a memory cell array is increased. One of the transistors provided in the memory cell is a transistor for controlling the amount of electric charge of the capacitor. In one embodiment of the present invention, the leakage current of this transistor is reduced. To reduce the leakage current of the transistor, a semiconductor material having a wider band gap than silicon is used for a channel region. Accordingly, a semiconductor memory device which can hold stored data for a certain period even when power is not supplied is provided.

That is, one embodiment of the present invention is a semiconductor memory device including a memory cell including a first transistor, a second transistor, and a capacitor. The first transistor includes a first semiconductor layer; a first gate insulating layer over and in contact with the first semiconductor layer; a first gate electrode which is in contact with the first gate insulating layer and overlaps with the first semiconductor layer; and a source region and a drain region with a region of the first semiconductor layer overlapping with the first gate electrode located therebetween. The second transistor includes a second semiconductor layer which overlaps with the first gate electrode and is electrically connected to the first gate electrode; a second gate insulating layer in contact with a side surface of the second semiconductor layer; and a second gate electrode which is in contact with the second gate insulating layer and at least partly covers the side surface of the second semiconductor layer. The capacitor includes a capacitor layer in contact with a side surface of the first gate electrode, and a first capacitor electrode which is in contact with the capacitor layer and at least partly covers the side surface of the first gate electrode.

The first gate electrode functions as a source electrode or a drain electrode of the second transistor, and the second semiconductor layer is formed so as to overlap with the first gate electrode. Thus, the source electrode and the drain electrode of the second transistor are formed substantially vertically to a substrate over which the transistors are formed, with the second semiconductor layer located between the source electrode and the drain electrode. Accordingly, the area occupied by the second transistor can be made smaller than that occupied by a planar transistor, for example.

The first gate electrode of the first transistor is used as one electrode of the capacitor; thus, the area occupied by the capacitor can be small.

In the semiconductor memory device, when the second transistor is turned on, a potential difference is generated between the one electrode of the capacitor, that is, the first gate electrode of the first transistor and the first capacitor electrode, which is the other electrode of the capacitor. Electric charge corresponding to the potential difference is held in the capacitor. After that, the first transistor is turned off, whereby the written data can be held.

Further, in the semiconductor memory device, the second semiconductor layer preferably includes a semiconductor material having a wider band gap than silicon.

By applying a semiconductor material having a wider band gap than silicon to the second semiconductor layer, the off-state current of the second transistor can be reduced. Thus, the semiconductor memory device which can hold stored data for a long period even when power is not supplied, as compared to the case where silicon is used for the second transistor, can be provided.

Further, the semiconductor memory device is not degraded even after writing and erasing are performed repeatedly because a carrier does not harm the gate insulating layers in data writing and data erasing unlike a floating gate (FG) nonvolatile memory. That is, the semiconductor memory device can have higher reliability in data holding than an FG nonvolatile memory. Thus, a semiconductor memory device having a large number (e.g., one million times or more) of write cycles can be provided.

Further, in the semiconductor memory device, the second semiconductor layer preferably includes an oxide semiconductor.

By applying an oxide semiconductor to the second semiconductor layer, the off-state current of the second transistor is reduced; accordingly, a semiconductor memory device which can hold stored data even when power is not supplied can be provided. Further, the oxide semiconductor film can be formed at a temperature generally used in a process of manufacturing a semiconductor using a silicon wafer, for example, lower than 1000° C.; thus, the semiconductor memory device can be manufactured easily. By using an oxide semiconductor on which heat treatment or the like is not performed after its formation for the second semiconductor layer, the second transistor having a field-effect mobility of more than 100 cm$^2$/V·sec can be obtained, for example. By using the second transistor having such high field-effect mobility, a semiconductor memory device having high writing speed can be obtained.

Another embodiment of the present invention is a semiconductor memory device including a memory cell including a first transistor, a second transistor, and a capacitor. The first transistor includes a first semiconductor layer; a first gate insulating layer over and in contact with the first semiconductor layer; a first gate electrode which is in contact with the first gate insulating layer and overlaps with the first semiconductor layer; and a source region and a drain region with a region of the first semiconductor layer overlapping with the first gate electrode located therebetween. The second transistor includes a second semiconductor layer which overlaps with the first gate electrode and is electrically connected to the first gate electrode; a second gate insulating layer in contact with a side surface of the second semiconductor layer; and a second gate electrode which is in contact with the second gate insulating layer and at least partly covers the side surface of the second semiconductor layer. The capacitor includes a second capacitor electrode electrically connecting the first gate electrode to the second semiconductor layer; a capacitor layer in contact with the second capacitor electrode; and a first capacitor electrode which is in contact with the capacitor layer and at least partly covers a side surface of the second capacitor electrode.

The first gate electrode functions as a source electrode or a drain electrode of the second transistor, and the second semiconductor layer is formed so as to overlap with the first gate electrode. Thus, the source electrode and the drain electrode of the second transistor are formed vertically to a substrate over which the transistors are formed, with the second semiconductor layer located between the source electrode and the drain electrode. Accordingly, the area occupied by the second transistor can be made smaller than that occupied by a planar transistor, for example.

The second capacitor electrode and the first capacitor electrode are used as capacitor electrodes of the capacitor. Further, the capacitor overlaps with the first transistor and the second transistor. Thus, the area occupied by the capacitor can be small, as compared to the case where the first transistor, the capacitor, and the second transistor do not overlap with one another.

The provision of the second capacitor electrode facilitates an electrical connection between the first gate electrode and the second semiconductor layer.

In the semiconductor memory device, when the second transistor is turned on, a potential difference is generated between the one electrode of the capacitor, that is, the second capacitor electrode and the first capacitor electrode. Electric charge corresponding to the potential difference is held in the capacitor. After that, the first transistor is turned off, whereby the written data can be held.

Further, in the semiconductor memory device, the second semiconductor layer preferably includes a semiconductor material having a wider band gap than silicon.

By applying a semiconductor material having a wider band gap than silicon to the second semiconductor layer, the off-state current of the second transistor can be reduced. Thus, the semiconductor memory device which can hold stored data even when power is not supplied can be provided.

Further, the semiconductor memory device is not degraded even after writing and erasing are performed repeatedly because a carrier does not harm the gate insulating layers in data writing and data erasing unlike a floating gate (FG) nonvolatile memory. That is, the semiconductor memory device can have higher reliability in data holding than an FG nonvolatile memory. Thus, a semiconductor memory device having a large number (e.g., one million times or more) of write cycles can be provided.

Further, in the semiconductor memory device, the second semiconductor layer preferably includes an oxide semiconductor.

By applying an oxide semiconductor to the second semiconductor layer, the off-state current of the second transistor is reduced; accordingly, a semiconductor memory device which can hold stored data even when power is not supplied can be provided. Further, the oxide semiconductor film can be formed at a temperature generally used in a process of manufacturing a semiconductor using a silicon wafer, for example, lower than 1000° C.; thus, the semiconductor memory device can be manufactured easily. By using an oxide semiconductor on which heat treatment or the like is not performed after its formation for the second semiconductor layer, the second transistor having a field-effect mobility of more than 100 $cm^2$/V·sec can be obtained, for example. By using the second transistor having such high field-effect mobility, a semiconductor memory device having high writing speed can be obtained.

According to one embodiment of the present invention, a semiconductor memory device having a high degree of integration can be provided. Further, a semiconductor memory device which can hold stored data even when power is not supplied can be provided. Still further, a semiconductor memory device which has a large number of write cycles can be provided.

According to one embodiment of the present invention, by placing the second semiconductor layer of the second transistor so as to overlap with the first gate electrode, the degree of integration of the memory cell array can be improved. Further, by forming the transistor for controlling the amount of electric charge of the capacitor in the memory cell using a semiconductor material having a wider band gap than silicon, a semiconductor memory device which can hold stored data even when power is not supplied can be provided. Further, by forming the transistor for controlling the amount of electric charge of the capacitor in the memory cell using a transistor having a smaller leakage current, a semiconductor memory device which is non-volatile and does not have a limitation on the number of write cycles can be provided.

BRIEF DESCRIPTION OF THE DRAWINGS

FIGS. 10A to 10C are cross-sectional views each illustrating a manufacturing step of the semiconductor memory device according to one embodiment of the present invention.

FIGS. 11A to 11C are cross-sectional views each illustrating a manufacturing step of the semiconductor memory device according to one embodiment of the present invention.

DETAILED DESCRIPTION OF THE INVENTION

Hereinafter, embodiments of the present invention are described in details with reference to the accompanying drawings. Note that the present invention is not limited to the description below, and it is easily understood by those skilled in the art that a variety of changes and modifications can be made without departing from the spirit and scope of the present invention. Accordingly, the invention should not be construed as being limited to the description of the embodiments below.

Embodiment 1

In this embodiment, an example of a structure of a semiconductor memory device, which is one embodiment of the present invention, is described with reference to FIGS. 1A to 1C.

Figure 1A:
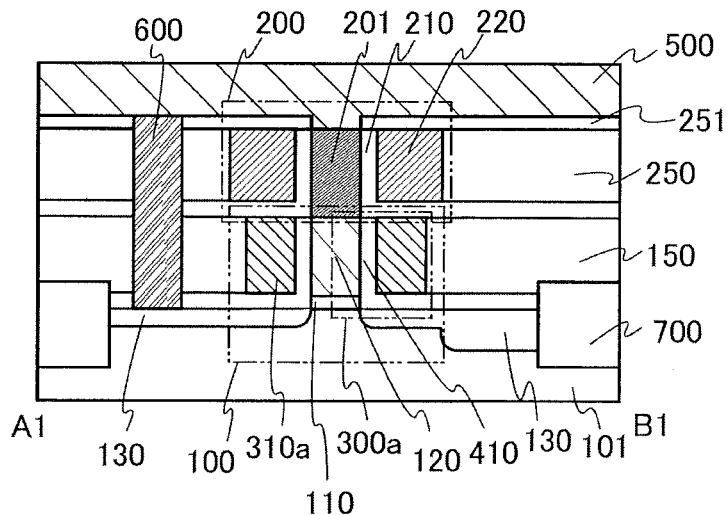
FIGS. 1A to 1C are a cross-sectional view, a top view, and a circuit diagram of a semiconductor memory device according to one embodiment of the present invention.
Figure 1B:
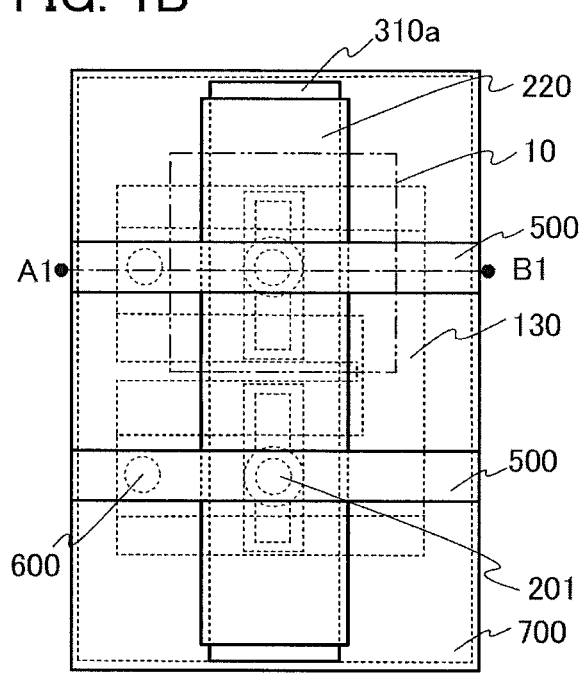

FIG. 1B is a schematic top view of a semiconductor memory device 1, and FIG. 1A is a schematic cross-sectional view along dashed dotted line A1-B1 in FIG. 1B. FIG. 1C is a circuit diagram of the semiconductor memory device 1.

The semiconductor memory device 1 described in this embodiment includes a plurality of bit lines 500 which are parallel to each other, and a plurality of first word lines 105 and a plurality of second word lines 106 which are perpendicular to the bit lines 500. Further, a first transistor 100, a second transistor 200, and a capacitor 300a are formed in a region overlapping with the bit line 500, the first word line 105, and the second word line 106. A memory cell 10 includes the first transistor 100, the second transistor 200, and the capacitor 300a. Note that the first word line 105 is electrically connected to a first capacitor electrode 310a, and the second word line 106 is electrically connected to a second gate electrode 220.

((First Transistor))

The first transistor 100 is described. The first transistor 100 includes a first semiconductor layer 101, a first gate insulating layer 110 over and in contact with the first semiconductor layer 101, a first gate electrode 120 which is in contact with the first gate insulating layer 110 and overlaps with the first semiconductor layer 101, source and drain regions 130 between which a region of the first semiconductor layer 101 overlapping with the first gate electrode 120 is sandwiched, and a first interlayer film 150. The first gate electrode 120 is electrically connected to a second semiconductor layer 201 of the second transistor 200. Further, the first gate electrode 120 functions as one electrode of the capacitor 300a.

One of the source and drain regions 130 is electrically connected to the bit line 500 through a conductive layer 600. The other of the source and drain regions 130 is used as a wiring, and is electrically connected to one of the source and drain regions 130 of an adjacent first transistor 100. In order to lower the electric resistance of the source and drain regions 130, the source and drain regions 130 are doped with an impurity at a high concentration. Further, the source and drain regions 130 are electrically isolated from a source region or a drain region of an adjacent element by an insulating layer 700.

(First Semiconductor Layer)

The first semiconductor layer 101 can be formed using single crystal silicon, polysilicon, microcrystalline silicon, or an oxide semiconductor, for example. The first transistor 100 is a transistor for performing data reading, which is described later; thus, a transistor having high switching speed is preferably applied to the first transistor 100. Therefore, the first semiconductor layer 101 is preferably formed using single crystal silicon.

(First Gate Insulating Layer)

As a material of the first gate insulating layer 110, an insulator can be used. For example, silicon oxide, hafnium oxide, yttrium oxide, hafnium silicate, hafnium aluminate, hafnium silicate to which nitrogen is added, hafnium aluminate to which nitrogen is added, lanthanum oxide, or the like can be used. As a material used for the first gate insulating layer 110, an appropriate material can be used depending on the material of the first semiconductor layer 101 used for the first transistor 100. Further, the thickness of the first gate insulating layer 110 may be set as appropriate depending on the channel length of the first transistor 100.

(First Gate Electrode)

For the first gate electrode 120, a material having electric conductivity and adhesion to the first gate insulating layer 110 can be used. The first gate electrode 120 can be formed using low-resistance polysilicon (polysilicon to which an impurity such as phosphorus imparting conductivity is added); a metal material such as molybdenum, titanium, tantalum, copper, tungsten, aluminum, chromium, neodymium, or scandium; or an alloy material including any of these materials as its main component. The first gate electrode 120 may be formed so as to have a single layer structure or a stacked structure.

(Source and Drain Regions)

The source and drain regions 130 preferably have favorable ohmic contacts with source and drain electrodes and have low resistance in the direction perpendicular to the thickness direction. Further, the source and drain regions 130 are preferably connected to a channel formation region of the first semiconductor layer 101 without generating resistance. In the case where silicon is used for the first semiconductor layer 101, a shallow PN junction is preferably formed so that the first gate electrode 120 does not overlap with the source and drain regions 130.

(First Interlayer Film)

For the first interlayer film 150, an insulator can be used. For example, an inorganic substance such as silicon oxide, silicon oxynitride, silicon nitride, or aluminum oxide can be used. Further, for example, an organic resin such as an acrylic resin or a polyimide resin can be used.

(Conductive Layer)

The conductive layer 600 is formed so as to be electrically connected to the first semiconductor layer 101 and the bit line 500, and can be formed in such a manner that, for example, metal is embedded and then planarization treatment is performed by a CMP method or the like.

(Insulating Layer)

The insulating layer 700 may be formed using silicon oxide, silicon nitride, or the like. For example, by local oxidation of silicon (LOCOS) or shallow trench isolation (STI), a plurality of element formation regions which is separated by an oxide film is formed in the single crystal semiconductor substrate.

((Capacitor))

Next, the capacitor 300a is described. The capacitor 300a includes the first capacitor electrode 310a and a capacitor layer 410 which is in contact with the first gate electrode 120, and the first gate electrode functions as one electrode of the capacitor. Since the first gate electrode 120 of the first transistor 100 is used as the one electrode of the capacitor 300a, the area occupied by the capacitor 300a can be small. As a result, the area occupied by the semiconductor memory device can be reduced.

(First Capacitor Electrode)

The first capacitor electrode 310a can be formed using low-resistance polysilicon; a metal material such as molybdenum, titanium, tantalum, copper, tungsten, aluminum, chromium, neodymium, or scandium; or an alloy material including any of these materials as its main component. Note that the first capacitor electrode 310a is electrically connected to the first word line 105.

(Capacitor Layer)

For the capacitor layer 410, an insulator can be used. For example, an inorganic substance such as silicon oxide, silicon oxynitride, or silicon nitride can be used. In the case where low-resistance polysilicon is used for the first gate electrode 120, an oxide film is formed on a surface of the first gate electrode 120 by they oxidation or the like, and can be used as the capacitor layer 410.

In the capacitor 300a, the first gate electrode 120 of the first transistor 100 is used as the one electrode. Thus, the area occupied by the capacitor 300a can be reduced.

((Second Transistor))

Next, the second transistor 200 is described. The second transistor 200 includes the second semiconductor layer 201 which overlaps with the first gate electrode 120 and is electrically connected to the first gate electrode 120, a second gate insulating layer 210 in contact with a side surface of the second semiconductor layer 201, and the second gate electrode 220 which is in contact with the second gate insulating layer 210 and at least partly covers the side surface of the second semiconductor layer 201. Further, the bit line 500 is electrically connected to the second semiconductor layer 201.

(Second Semiconductor Layer)

The shape of the second semiconductor layer 201 is described. The side surface of the second semiconductor layer 201 is covered with the second gate electrode 220 with the second gate insulating layer 210 interposed therebetween. Thus, the second transistor 200 is a vertical transistor in which the second gate electrode 220 covering the side surface of the second semiconductor layer 201 functions as a gate, the first gate electrode 120 in contact with the bottom surface of the second semiconductor layer 201 functions as a source electrode, and the bit line 500 in contact with the top surface of the second semiconductor layer 201 functions as a drain electrode. Thus, the area occupied by the second transistor 200 can be reduced.

Further, the second transistor 200 has an extremely small off-state current. Thus, with the second transistor 200, a semiconductor memory device can hold stored data even when power is not supplied. Further, with the second transistor 200, data can be held in the capacitor 300a for a long period. Thus, in the semiconductor memory device, a data rewrite operation (hereinafter, also referred to as refresh operation) at regular intervals is unnecessary or the frequency of refresh operations can be extremely low; consequently, the semiconductor memory device can substantially function as a non-volatile semiconductor memory device.

Since the second transistor 200 is a transistor with extremely low off-state current, the size of the capacitor 300a for holding electric charge can be reduced. Further, the time needed for writing and reading can be reduced with the reduction in the size of the capacitor 300a, so that the semiconductor memory device can operate at high speed.

Although depending on the thickness of the second gate insulating layer 210, the channel length of the second transistor 200 is preferably, for example, 10 or more times, further preferably 20 or more times the length of the diagonal or the diameter of the second semiconductor layer 201, in which case a short-channel effect can be reduced.

Note that FIG. 1B shows that the second semiconductor layer 201 is cylindrical-shaped; however, the second semiconductor layer 201 may be prismatic-shaped. For example, when the second semiconductor layer 201 is prismatic-shaped, the effective width of the channel Mimed near the side surfaces of the second semiconductor layer 201 can be large, so that the on-state current of the second transistor 200 can be increased. In contrast, when the second semiconductor layer 201 is cylinder-shaped, its side surface has no protrusion and thus a gate electric field is evenly applied to the side surface; consequently, the second transistor 200 can have high reliability. In order to further increase the on-state current, the shape of a bottom surface of the second semiconductor layer 201 may be, for example, a polygon that contains at least one interior angle larger than 180° (a concave polygon), such as a star polygon.

For the second semiconductor layer 201, a semiconductor whose band gap is wider than that of silicon is preferably used. Specifically, the band gap of silicon (1.1 eV) is not high enough to give very high off-resistance. It is necessary to use a wide band gap semiconductor with a band gap ranging from 2.5 eV to 4 eV, preferably from 3 eV to 3.8 eV. For example, an oxide semiconductor such as indium oxide or zinc oxide, a nitride semiconductor such as gallium nitride, a sulfide semiconductor such as zinc sulfide, or the like may be used. The use of such a semiconductor for a channel formation region can make the off-state current of the transistor extremely small.

Note that as the oxide semiconductor, a four-component metal oxide such as an In—Sn—Ga—Zn-based oxide semiconductor, a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor, a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor, an indium oxide, a tin oxide, a zinc oxide, or the like can be used. In this specification, an In—Sn—Ga—Zn-based oxide semiconductor means a metal oxide containing indium (In), tin (Sn), gallium (Ga), and zinc (Zn), and there is no particular limitation on the stoichiometric composition thereof.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor). For the details, Embodiment 6 can be referred to.

For example, an oxide semiconductor film may include a CAAC-OS. In the CAAC-OS, for example, c-axes are aligned; and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

(Second Gate Insulating Layer)

As a material of the second gate insulating layer 210, an insulator can be used. As a material for the second gate insulating layer 210, silicon oxide, silicon oxynitride, hafnium oxide, yttrium oxide, hafnium silicate, hafnium aluminate, hafnium silicate to which nitrogen is added, hafnium aluminate to which nitrogen is added, lanthanum oxide, or the like can be used. Silicon oxide whose oxygen content is in excess of that in the stoichiometric composition is preferable.

The second gate insulating layer 210 can be formed by a CVD method, a sputtering method, or the like. When a silicon oxide film or a silicon oxynitride film is formed by a CVD method as the second gate insulating layer 210, glow discharge plasma is preferably generated by application of high-frequency power with a frequency of 3 MHz to 30 MHz, typically 13.56 MHz or 27.12 MHz in the HF band, or high-frequency power with a frequency of approximately 30 MHz to 300 MHz in the VHF band, typically 60 MHz. Alternatively, glow discharge plasma can be generated by applying high-frequency power at a microwave frequency of 1 GHz or more. Note that a pulsed oscillation by which high-frequency power is applied in a pulsed manner or a continuous oscillation by which high-frequency power is applied continuously may be applied. A silicon oxide film or a silicon oxynitride which is formed using a microwave frequency of 1 GHz or more has a smaller fixed electric charge in the film or at the interface with the second semiconductor layer 201 than a silicon oxide film or a silicon oxynitride which is formed by a normal plasma CVD method. Thus, the second transistor 200 can have high reliability in electrical characteristics such as threshold voltage.

Further, the thickness of the second gate insulating layer 210 may be set as appropriate depending on the channel length of the second transistor 200.

(Second Gate Electrode)

For the second gate electrode 220, a material having electric conductivity and adhesion to the second gate insulating layer 210 can be used. The second gate electrode 220 can be formed using low-resistance polysilicon; a metal material such as molybdenum, titanium, tantalum, copper, tungsten, aluminum, chromium, neodymium, or scandium; or an alloy material including any of these materials as its main component. The second gate electrode 220 may have a single-layer structure or a stacked structure. Note that the second gate electrode 220 is electrically connected to the second word line 106.

(Second Interlayer Film)

For a second interlayer film 250, an insulator can be used. For example, an inorganic substance such as silicon oxide, silicon oxynitride, silicon nitride, or aluminum oxide can be used. Further, for example, an organic resin such as an acrylic resin or a polyimide resin can be used.

(Insulating Film)

For an insulating film 251, an insulator can be used. For example, an inorganic substance such as silicon oxide, silicon oxynitride, silicon nitride, or aluminum oxide can be used. The insulating film 251 is formed so that the bit line 500 is electrically connected to the second gate electrode 220.

In FIG. 1A, the second gate electrode 220 covers the side surface of the second semiconductor layer 201 with the second gate insulating layer 210 interposed therebetween; however, the second gate electrode 220 may be formed so as to at least partly cover the side surface of the second semiconductor layer 201. For example, the second gate electrode 220 is formed on only one side of the side surface of the second semiconductor layer 201, so that the degree of integration in the direction of the bit line 500 can be increased. On the other hand, when the second gate electrode 220 covers the side surface of the second semiconductor layer 201 as illustrated in FIGS. 1A and 1B, the effective channel width of the second transistor 200 can be large and the on-state current can be increased as a result.

(Bit Line)

For the bit line 500, a material with low electrical resistance is preferably used. For example, a single film of aluminum, titanium, tungsten, or copper, a stacked film of titanium and aluminum, or the like is preferably used.

Next, data writing and data reading of the semiconductor memory device are described.

<Data Writing>

When data is written, the second transistor 200 is turned on. When the second transistor 200 is turned on, a potential difference is generated between the one electrode of the capacitor 300a, that is, the first gate electrode 120 of the first transistor 100 and the capacitor layer 410, which is the other electrode of the capacitor. Electric charge corresponding to the potential difference is held in the capacitor 300a. After that, the first transistor 100 is turned off, whereby the written data can be held.

<Data Reading>

Data is read by determining whether the first transistor 100 is in an on state or an off state. When a high-level potential is held in the capacitor 300a, the first transistor 100 is in an on state, and thus, a high-level potential supplied to a source line is output to the bit line 500 through the first transistor 100. Accordingly, a change in the potential of the bit line 500 is detected by a reading circuit, such as a sense amplifier, connected to the bit line 500; thus, the data can be read.

As described above, in the semiconductor memory device 1 described in this embodiment, the first gate electrode 120 of the first transistor 100 is used as the one electrode of the capacitor 300a. Thus, the area occupied by the capacitor 300a can be reduced. The ratio of the area occupied by the second transistor 200 to the surface area of the substrate is extremely low. The second transistor 200 is provided over the first transistor 100. Thus, the area occupied by the semiconductor memory device can be small.

Further, the second transistor 200 including the second semiconductor layer formed using an oxide semiconductor is a transistor having an extremely small off-state current. Thus, with the second transistor 200, a semiconductor memory device can hold stored data even when power is not supplied. Further, the semiconductor memory device is not degraded even after writing and erasing are performed repeatedly because a carrier does not harm a gate insulating layer in data writing and data erasing unlike a floating gate (FG) nonvolatile memory. That is, the semiconductor memory device can have higher reliability in data holding than an FG nonvolatile memory. Thus, a semiconductor memory device having a large number (e.g., one million times or more) of write cycles can be provided.

Embodiment 2

In this embodiment, an example of a structure of a semiconductor memory device, which is one embodiment of the present invention, is described with reference to FIGS. 2A to 2C.

Figure 2A:
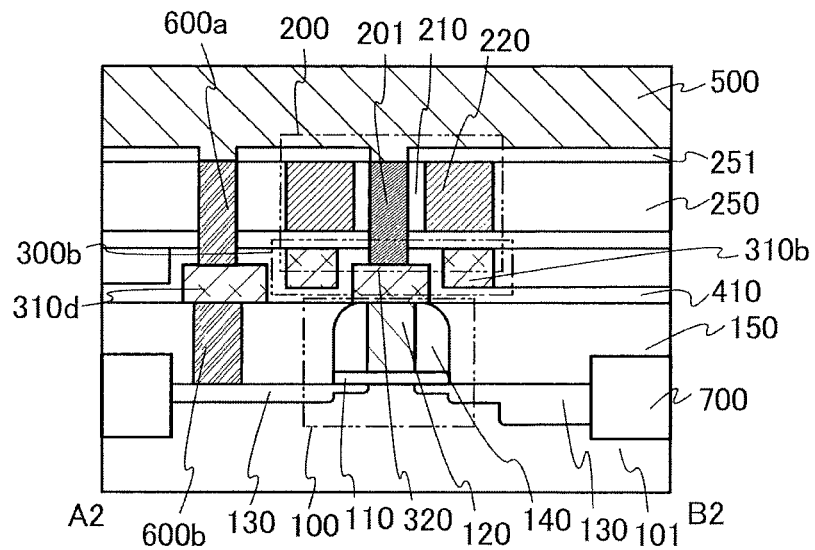
FIGS. 2A to 2C are a cross-sectional view, a top view, and a circuit diagram of a semiconductor memory device according to one embodiment of the present invention.
Figure 2B:
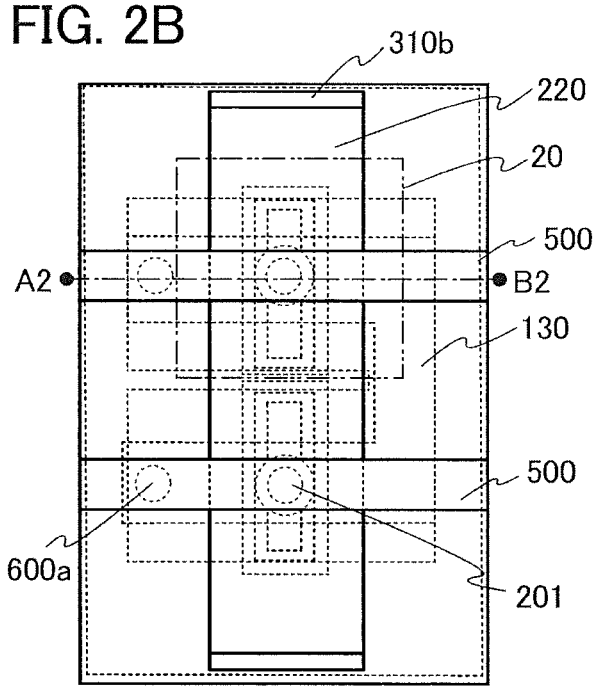

FIG. 2B is a schematic top view of a semiconductor memory device 2, and FIG. 2A is a schematic cross-sectional view along dashed dotted line A2-B2 in FIG. 2B. FIG. 2C is a circuit diagram of the semiconductor memory device 2.

The semiconductor memory device 2 described in this embodiment includes the plurality of bit lines 500 which are parallel to each other and the plurality of first word lines 105 and the plurality of second word lines 106 which are perpendicular to the bit lines 500. Further, the first transistor 100, the second transistor 200, and a capacitor 300b are formed in a region overlapping with the bit line 500, the first word line 105, and the second word line 106. A memory cell 20 includes the first transistor 100, the second transistor 200, and the capacitor 300b. Note that the first word line 105 is electrically connected to a first capacitor electrode 310b, and the second word line 106 is electrically connected to the second gate electrode 220.

((First Transistor))

The first transistor 100 is described. The first transistor 100 includes the first semiconductor layer 101, the first gate insulating layer 110 over and in contact with the first semiconductor layer 101, the first gate electrode 120 which is in contact with the first gate insulating layer 110 and overlaps with the first semiconductor layer 101, a sidewall layer 140 in contact with the first gate electrode 120, the source and drain regions 130 between which a region of the first semiconductor layer 101 overlapping with the first gate electrode 120 is sandwiched, and the first interlayer film 150. The first gate electrode 120 is electrically connected to the second semiconductor layer 201 of the second transistor 200. Further, the first gate electrode 120 functions as one electrode of the capacitor 300b.

The first gate electrode 120 is electrically connected to a second capacitor electrode 320 (described later) of the capacitor 300b.

The one of the source and drain regions 130 is electrically connected to the bit line 500 through a conductive layer 600a, a buffer layer 310d formed at the same time as the first capacitor electrode 310b, and a conductive layer 600b. Further, the source and drain regions 130 are electrically isolated from a source region or a drain region of an adjacent element by an insulating layer 700.

Embodiment 1 can be referred to for the details of the first semiconductor layer 101, the first gate insulating layer 110, the first gate electrode 120, the source and drain regions 130, the first interlayer film 150, and the insulating layer 700. The description of the conductive layer 600 in Embodiment 1 can be referred to for the details of the conductive layers 600a and 600b.

(Sidewall Layer)

The sidewall layer 140 can be formed using silicon oxide, silicon nitride, or the like. The source and drain regions 130 can be separated from a channel formation region by the sidewall layer 140. It is preferable to employ a lightly doped drain (LDD) structure having an LDD region between the channel formation region and the drain region (or the source region).

((Capacitor))

Next, the capacitor 300b is described. The capacitor 300b includes the second capacitor electrode 320 which electrically connects the first gate electrode 120 to the second semiconductor layer 201, the capacitor layer 410 in contact with the second capacitor electrode 320, and the first capacitor electrode 310b in contact with the capacitor layer 410. The second capacitor electrode 320 functions as the one electrode of the capacitor 300b.

The description of the first capacitor electrode 310a in Embodiment 1 can be referred to for the details of the first capacitor electrode 310b. Further, Embodiment 1 can be referred to for the details of the capacitor layer 410.

(Second Capacitor Electrode)

The second capacitor electrode 320 can be formed using low-resistance polysilicon; a metal material such as molybdenum, titanium, tantalum, copper, tungsten, aluminum, chromium, neodymium, or scandium; or an alloy material including any of these materials as its main component. The provision of the second capacitor electrode 320 facilitates an electrical connection between the first gate electrode 120 and the second semiconductor layer 201.

As for the width of the second capacitor electrode 320 (the width in the channel formation direction of the first transistor 100) and the thickness of the second capacitor electrode 320, the ratio of the thickness to the width is preferably high. This is because, in the case where the thickness of the second capacitor electrode 320 is large, the second capacitor electrode 320 can be used as one electrode of the capacitor, so that the area occupied by the capacitor can be small.

In the capacitor 300b, the second capacitor electrode 320 and the first capacitor electrode 310b are used as capacitor electrodes. Thus, the area occupied by the capacitor 300b can be reduced.

((Second Transistor))

Next, the second transistor 200 is described. The second transistor 200 includes the second semiconductor layer 201, the second gate insulating layer 210, and the second gate electrode 220. The second transistor 200 is provided so as to overlap with the first gate electrode 120. The second semiconductor layer 201 is electrically connected to the first gate electrode 120. The second gate insulating layer 210 is in contact with the side surface of the second semiconductor layer 201. The second gate electrode 220 is formed in contact with the second gate insulating layer 210, and the side surface of the second semiconductor layer 201 is at least partly covered. The bit line 500 is electrically connected to the second semiconductor layer 201.

Embodiment 1 can be referred to for the details of the second transistor. Further, Embodiment 1 can be referred to for the details of the second semiconductor layer 201, the second gate insulating layer 210, the second gate electrode 220, the second interlayer film 250, the insulating film 251, and the bit line 500. Furthermore, Embodiment 1 can be referred to for data writing and data reading of the semiconductor memory device.

As described above, in the semiconductor memory device 2 described in this embodiment, the second capacitor electrode 320 functions as a source electrode or a drain electrode of the second transistor 200. Thus, the source electrode and the drain electrode of the second transistor 200 are formed vertically to a substrate over which the transistors are formed. Accordingly, the area occupied by the second transistor 200 can be made smaller than that occupied by a planar transistor, for example. Therefore, a semiconductor memory device having a high degree of integration can be provided.

The ratio of the area occupied by the second transistor 200 to the surface area of the substrate is extremely low. The second transistor 200 is provided over the first transistor 100. Thus, the area occupied by the semiconductor memory device can be reduced.

The provision of the second capacitor electrode 320 facilitates an electrical connection between the first gate electrode 120 and the second semiconductor layer 201.

Further, the second transistor 200 including the second semiconductor layer 201 formed using an oxide semiconductor is a transistor having an extremely small off-state current. Thus, with the second transistor 200, a semiconductor memory device can hold stored data even when power is not supplied. Further, the semiconductor memory device is not degraded even after writing and erasing are performed repeatedly because a carrier does not harm the gate insulating layer in data writing and data erasing unlike an FG nonvolatile memory. That is, the semiconductor memory device can have higher reliability in data holding than an FG nonvolatile memory. Thus, a semiconductor memory device having a large number (e.g., one million times or more) of write cycles can be provided.

Embodiment 3

In this embodiment, an example of a structure of a semiconductor memory device, which is one embodiment of the present invention, is described with reference to FIGS. 3A to 3C.

Figure 3A:
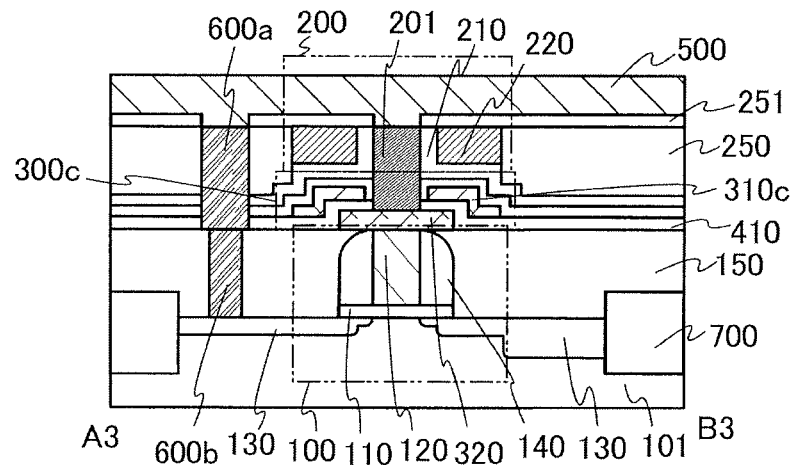
FIGS. 3A to 3C are a cross-sectional view, a top view, and a circuit diagram of a semiconductor memory device according to one embodiment of the present invention.
Figure 3B:
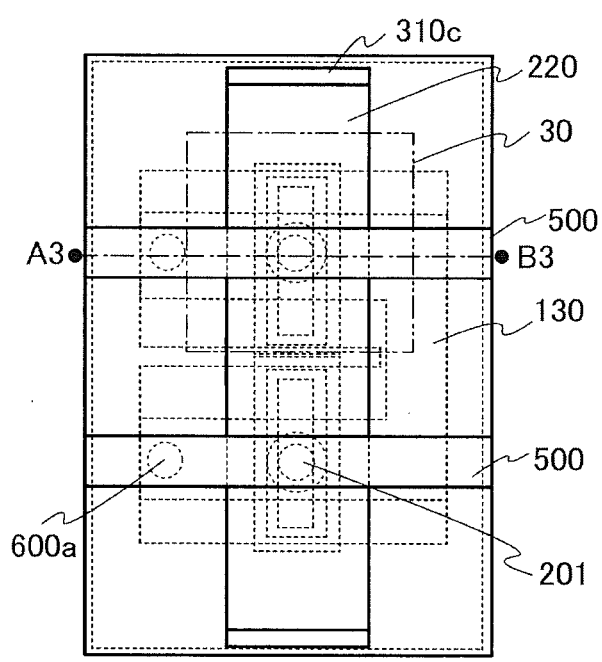
Figure 3C:
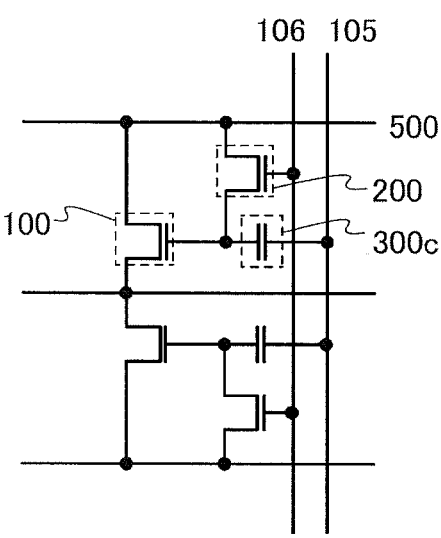

FIG. 3B is a schematic top view of a semiconductor memory device 3, and FIG. 3A is a schematic cross-sectional view along dashed dotted line A3-B3 in FIG. 3B. FIG. 3C is a circuit diagram of the semiconductor memory device 3.

The semiconductor memory device 3 described in this embodiment includes the plurality of bit lines 500 which are parallel to each other and the plurality of first word lines 105 and the plurality of second word lines 106 which are perpendicular to the bit lines 500. Further, the first transistor 100, the second transistor 200, and a capacitor 300c are formed in a region overlapping with the bit line 500, the first word line 105, and the second word line 106. A memory cell 30 includes the first transistor 100, the second transistor 200, and the capacitor 300c. Note that the first word line 105 is electrically connected to a first capacitor electrode 310c, and the second word line 106 is electrically connected to the second gate electrode 220.

((First Transistor))

The first transistor 100 is described. The first transistor 100 includes the first semiconductor layer 101, the first gate insulating layer 110 over and in contact with the first semiconductor layer 101, the first gate electrode 120 which is in contact with the first gate insulating layer 110 and overlaps with the first semiconductor layer 101, the sidewall layer 140 in contact with the first gate electrode 120, the source and drain regions 130 between which a region of the first semiconductor layer 101 overlapping with the first gate electrode 120 is sandwiched, and the first interlayer film 150. The first gate electrode 120 is electrically connected to the second semiconductor layer 201 of the second transistor 200. Further, the first gate electrode 120 functions as one electrode of the capacitor 300c.

The first gate electrode 120 is electrically connected to a second capacitor electrode 320 (described later) of the capacitor 300c.

The one of the source and drain regions 130 is electrically connected to the bit line 500 through a conductive layer 600a and a conductive layer 600b. Further, the source and drain regions 130 are electrically isolated from a source region or a drain region of an adjacent element by an insulating layer 700.

Embodiment 1 can be referred to for the details of the first semiconductor layer 101, the first gate insulating layer 110, the first gate electrode 120, the source and drain regions 130, the sidewall layer 140, the first interlayer film 150, and the insulating layer 700. The description of the conductive layer 600 in Embodiment 1 can be referred to for the details of the conductive layers 600a and 600b.

((Capacitor))

Next, the capacitor 300c is described. The capacitor 300c includes the second capacitor electrode 320 which electrically connects the first gate electrode 120 to the second semiconductor layer 201, the capacitor layer 410 in contact with the second capacitor electrode 320, and the first capacitor electrode 310c in contact with the capacitor layer 410. The second capacitor electrode 320 functions as the one electrode of the capacitor 300c.

The description of the first capacitor electrode 310a in Embodiment 1 can be referred to for the details of the first capacitor electrode 310c. Further, Embodiment 1 can be referred to for the details of the capacitor layer 410.

Embodiment 2 can be referred to for the details of the second capacitor electrode 320. Further, the width of the second capacitor electrode 320 (the width in the channel formation direction of the first transistor 100) may be determined depending on the capacitance of the capacitor; however, the width can be expanded to the ends of the sidewall layer 140 in the first transistor 100. By expanding the width of the second capacitor electrode 320 (the width in the channel formation direction of the first transistor 100), an acceptable range of error for alignment of the second capacitor electrode 320 and the second semiconductor layer 201 can be widened.

In the capacitor 300c, the second capacitor electrode 320 and the first capacitor electrode 310c are used as capacitor electrodes. Thus, the area occupied by the capacitor 300c can be reduced.

((Second Transistor))

Next, the second transistor 200 is described. The second transistor 200 includes the second semiconductor layer 201, the second gate insulating layer 210, and the second gate electrode 220. The second transistor 200 is provided so as to overlap with the first gate electrode 120. The second semiconductor layer 201 is electrically connected to the first gate electrode 120. The second gate insulating layer 210 is in contact with the side surface of the second semiconductor layer 201. The second gate electrode 220 is formed in contact with the second gate insulating layer 210, and the side surface of the second semiconductor layer 201 is at least partly covered. The bit line 500 is electrically connected to the second semiconductor layer 201.

Embodiment 1 can be referred to for the details of the second transistor. Further, Embodiment 1 can be referred to for the details of the second semiconductor layer 201, the second gate insulating layer 210, the second gate electrode 220, the second interlayer film 250, the insulating film 251, and the bit line 500. Furthermore, Embodiment 1 can be referred to for data writing and data reading of the semiconductor memory device.

As described above, in the semiconductor memory device 3 described in this embodiment, the second capacitor electrode 320 functions as a source electrode or a drain electrode of the second transistor 200. Thus, the source electrode and the drain electrode of the second transistor 200 are formed vertically to a substrate over which the transistors are formed. Accordingly, the area occupied by the second transistor 200 can be made smaller than that occupied by a planar transistor, for example. Therefore, a semiconductor memory device having a high degree of integration can be provided.

The ratio of the area occupied by the second transistor 200 to the surface area of the substrate is extremely low. The second transistor 200 is provided over the first transistor 100. Thus, the area occupied by the semiconductor memory device can be reduced.

The provision of the second capacitor electrode 320 facilitates an electrical connection between the first gate electrode 120 and the second semiconductor layer 201.

Further, the second transistor 200 including the second semiconductor layer 201 formed using an oxide semiconductor is a transistor having an extremely small off-state current. Thus, with the second transistor 200, a semiconductor memory device can hold stored data even when power is not supplied. Further, the semiconductor memory device is not degraded even after writing and erasing are performed repeatedly because a carrier does not harm the gate insulating layer in data writing and data erasing unlike an FG nonvolatile memory. That is, the semiconductor memory device can have higher reliability in data holding than an FG nonvolatile memory. Thus, a semiconductor memory device having a large number (e.g., one million times or more) of write cycles can be provided.

Embodiment 4

In this embodiment, a method for manufacturing a semiconductor memory device, which is one embodiment of the present invention, is described.

Figure 1C:
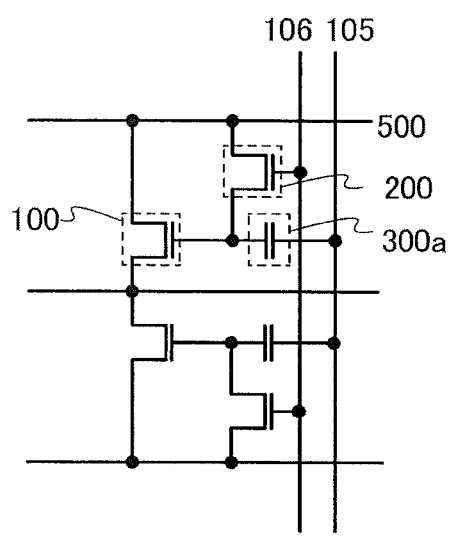

Hereinafter, steps for manufacturing the semiconductor memory device 1 illustrated in FIGS. 1A to 1C are described with reference to FIGS. 4A to 4E, FIGS. 5A to 5D, FIGS. 6A to 6C, and FIGS. 7A and 7B. The cross-sectional views along dashed dotted line A1-B1 of the top view of the semiconductor memory device 1 illustrate states after the respective steps. Top views illustrating states after the respective steps are not illustrated. No that in this embodiment, the case where single crystal silicon is used for the substrate is described. Embodiments 1 to 3 can be referred to for materials that can be used for components described below.

FIGS. 4A to 4E are cross-sectional views of the semiconductor memory device 1, which illustrate the steps from the step of forming the insulating layer 700 to the step of forming the capacitor layer 410.

Figure 4A:
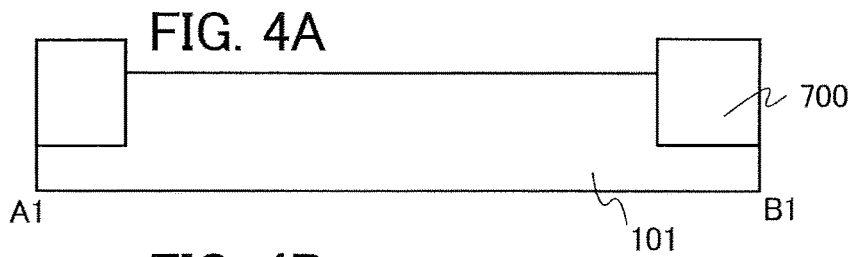
FIGS. 4A to 4E are cross-sectional views each illustrating a manufacturing step of the semiconductor memory device according to one embodiment of the present invention.

By forming the insulating layer 700, an electrically isolated region is formed in the single crystal semiconductor substrate. The insulating layer 700 is positioned so that the first transistor 100 is electrically isolated (FIG. 4A).

Figure 4B:
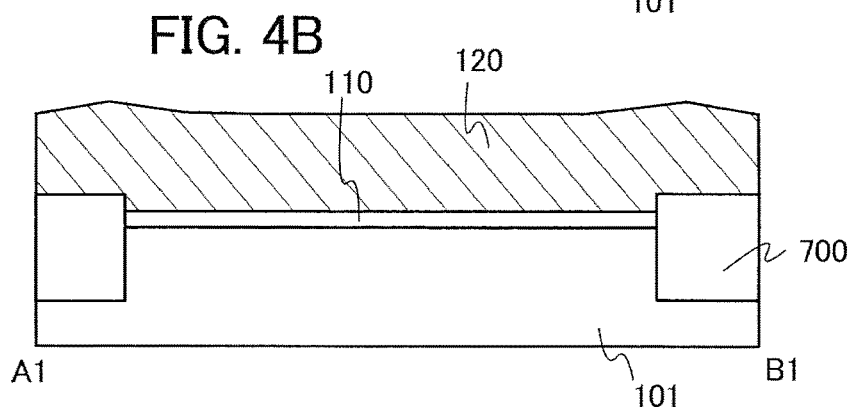

Next, the first gate insulating layer 110 is formed. For example, a thermal oxidation film may be used for the first gate insulating layer 110 (FIG. 4B).

Next, the first gate electrode 120 is formed. The first gate electrode 120 may be formed using low-resistance polysilicon or a metal such as tungsten (FIG. 4B).

Figure 4C:
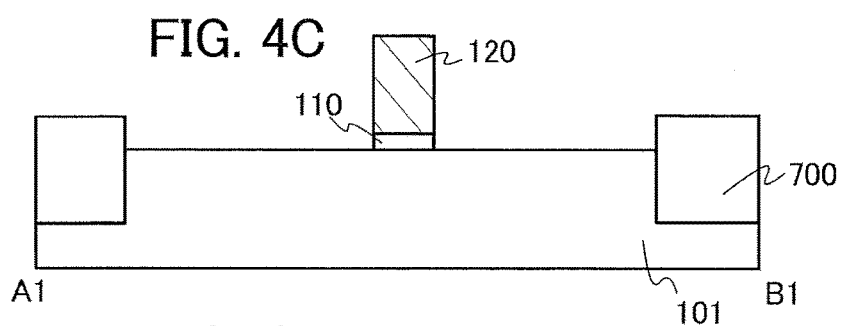

Next, by a photolithography method, the first gate electrode 120 is processed so as to have a desired length (FIG. 4C).

Figure 4D:
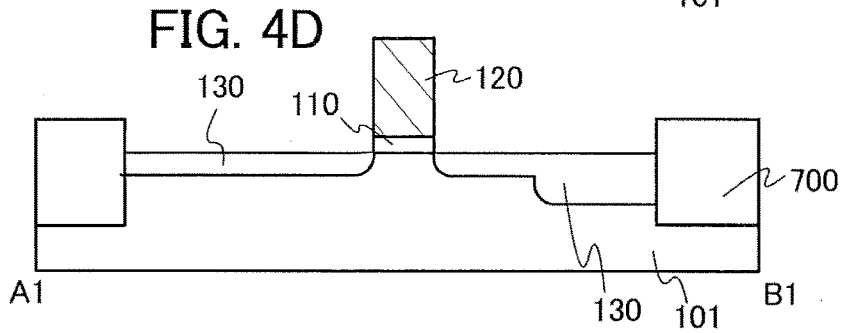

Next, regions where a source and a drain are to be formed are doped with an impurity, so that the source and drain regions 130 are formed. An impurity with which a transistor having a desirable conductivity type is formed may be injected in regions of silicon where the source and the drain are to be formed. The injection may be performed by an ion implantation method or the like (FIG. 4D).

Figure 4E:
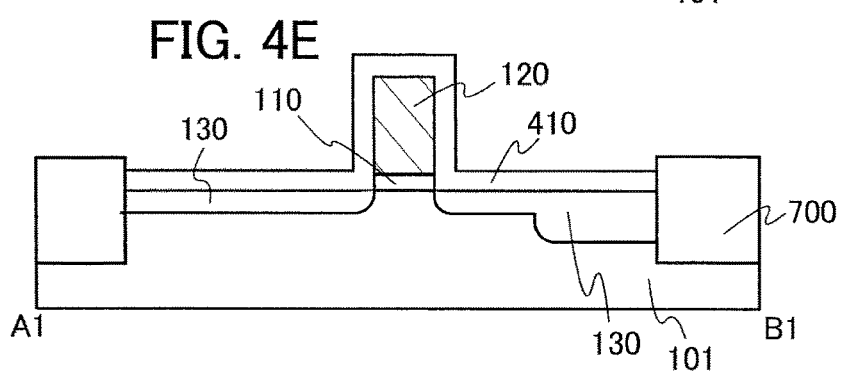

Next, the capacitor layer 410 is formed. The capacitor layer 410 functions as an insulating layer of the capacitor (FIG. 4E).

FIGS. 5A to 5D are cross-sectional views of the semiconductor memory device 1, which illustrate the steps from the step of forming the first interlayer film 150 to the step of forming the second gate insulating layer 210.

Next, the first interlayer film 150 is formed. For the first interlayer film 150, an insulator can be used. For example, silicon oxide, silicon oxynitride, silicon nitride, or the like may be formed by a CVD method. Alternatively, aluminum oxide or the like may be formed by a sputtering method.

Figure 5A:
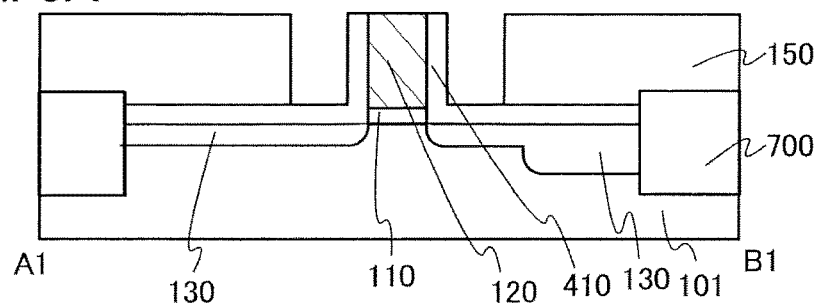
FIGS. 5A to 5D are cross-sectional views each illustrating a manufacturing step of the semiconductor memory device according to one embodiment of the present invention.

Next, a region where the first capacitor electrode 310a is to be formed is processed by a photolithography step and an etching step. A dry etching method is preferably used for the etching step to form a fine pattern (FIG. 5A).

The first capacitor electrode 310a can be formed using a semiconductor with low electrical resistance or metal. For example, for the first capacitor electrode 310a, low-resistance polysilicon may be formed by a CVD method. Alternatively, the first capacitor electrode 310a can be formed by a sputtering method using a metal material such as molybdenum, titanium, tantalum, copper, tungsten, aluminum, chromium, neodymium, or scandium; or an alloy material including any of these materials as its main component.

Figure 5B:
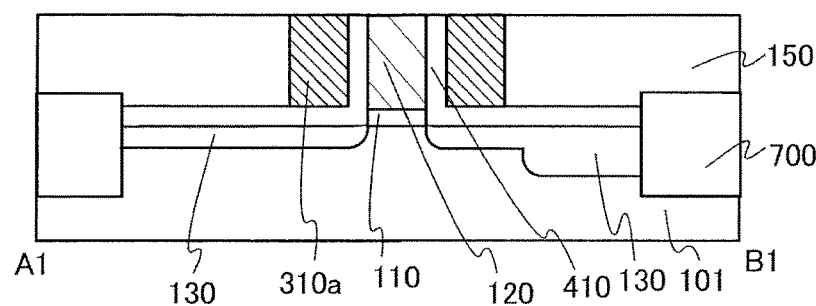

Next, the first capacitor electrode 310a is polished until the surface of the first gate electrode 120 is exposed. The polishing may be performed by CMP treatment, for example. Since the surface of the first gate electrode 120 is exposed by this polishing, the second semiconductor layer 201, which is formed in the next step, and the first gate electrode 120 can be electrically connected to each other (FIG. 5B).

Figure 5C:
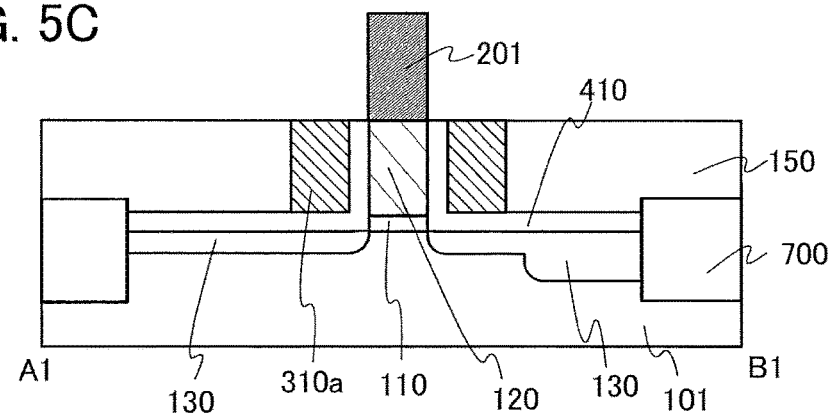

Next, the second semiconductor layer 201 is formed over the exposed surface of the first gate electrode 120. The second semiconductor layer 201 is preferably formed using an oxide semiconductor. The oxide semiconductor film can be formed by a sputtering method, for example (FIG. 5C).

In this embodiment, the second semiconductor layer 201 overlaps with the first gate electrode 120; however, the width of the second semiconductor layer 201 is not necessarily the same as that of the first gate electrode 120 as long as the second semiconductor layer 201 is electrically connected to the first gate electrode 120.

Figure 5D:
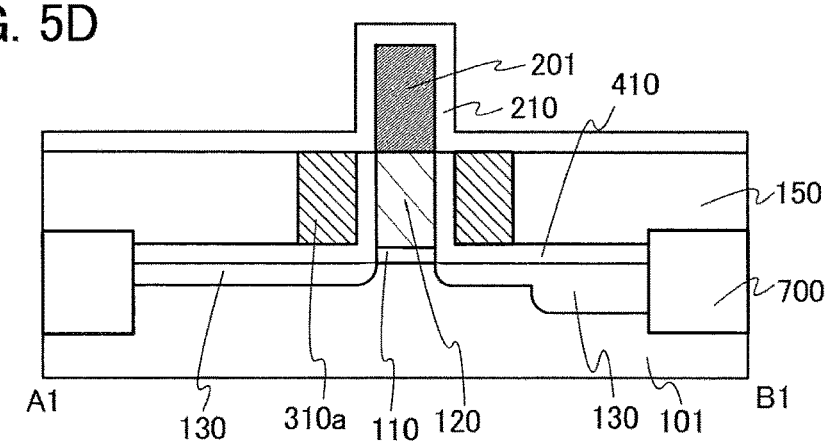

Next, the second gate insulating layer 210 is formed so as to cover the second semiconductor layer 201 (FIG. 5D).

Figure 6A:
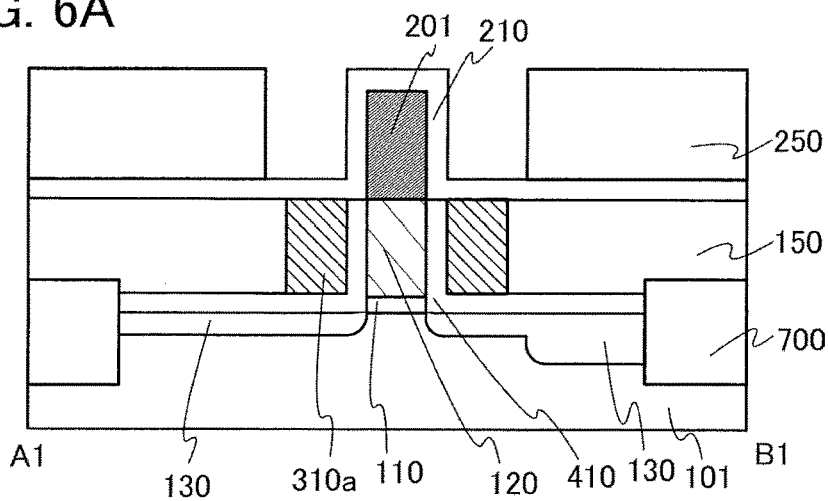
FIGS. 6A to 6C are cross-sectional views each illustrating a manufacturing step of the semiconductor memory device according to one embodiment of the present invention.
Figure 6B:
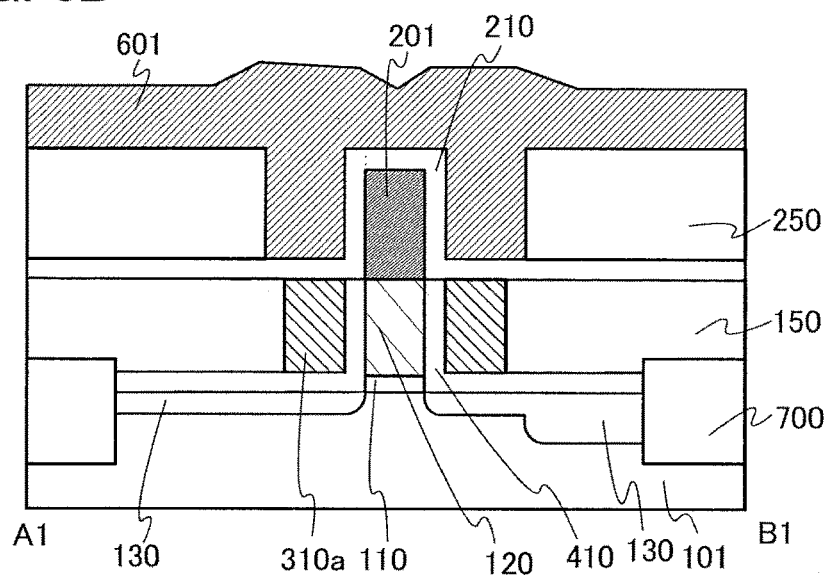
Figure 6C:
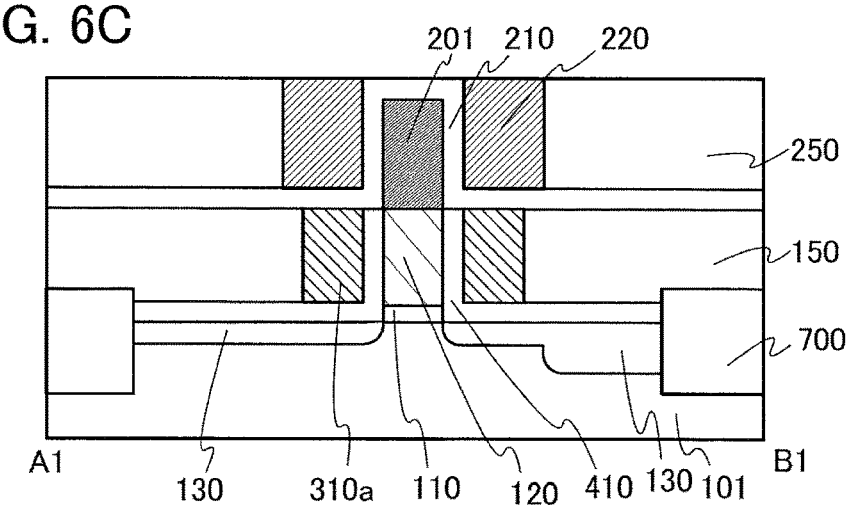

FIGS. 6A to 6C are cross-sectional views of the semiconductor memory device 1, which illustrate the steps from the step of forming a region where the second gate electrode 220 is to be formed to the step of forming the second gate electrode 220.

Next, the second interlayer film 250 is formed, and the region where the second gate electrode 220 is to be formed is formed by a photolithography step and an etching step. A dry etching method is preferably used for the etching step to form a fine pattern (FIG. 6A).

A conductive layer 601 is formed so as to fill a space in the pattern formed in the above manner (FIG. 6B). As the conductive layer 601, a material having electric conductivity and adhesion to the second gate insulating layer 210 can be used. For the conductive layer 601, low-resistance polysilicon; a metal material such as molybdenum, titanium, tantalum, copper, tungsten, aluminum, chromium, neodymium, or scandium; or an alloy material containing any of these materials as its main component can be used. Further, the conductive layer 601 has either a single layer structure or a stacked-layer structure.

Next, the second gate electrode 220 is formed by polishing the conductive layer 601 until at least a surface of the second gate insulating layer 210 is exposed (FIG. 6C). The polishing may be performed by CMP treatment, for example. In the case where the polishing is performed until a surface of the second semiconductor layer 201 is exposed, the second semiconductor layer 201 is damaged, which causes degradation of electrical characteristics of the second transistor. Thus, the conductive layer 601 is preferably polished so that the second gate insulating layer 210 remains.

Figure 7A:
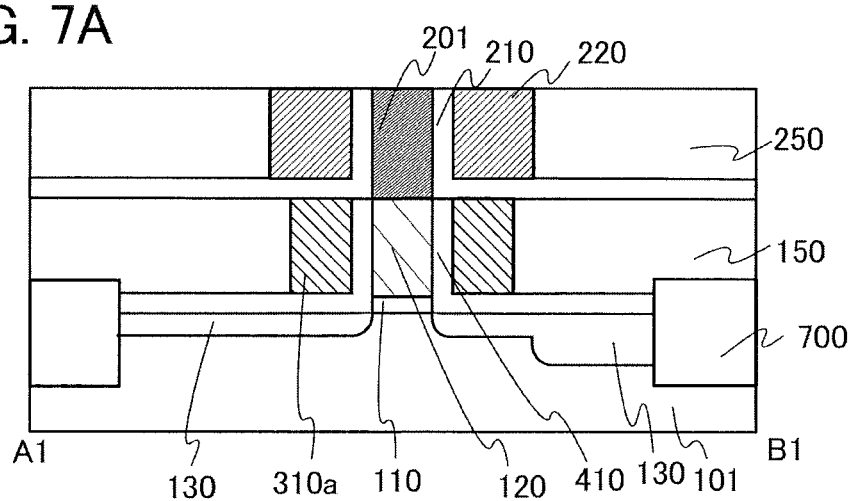
FIGS. 7A and 7B are cross-sectional views each illustrating a manufacturing step of the semiconductor memory device according to one embodiment of the present invention.
Figure 7B:
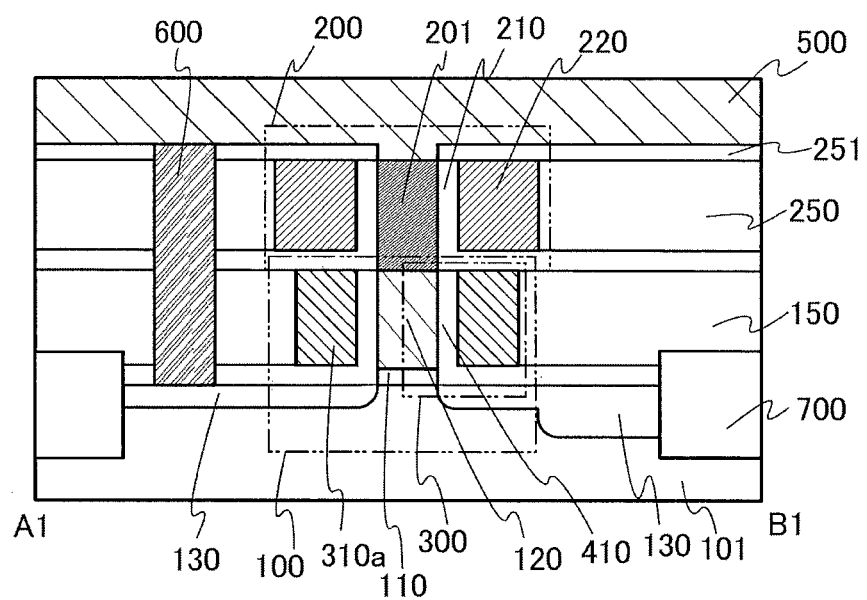

FIGS. 7A and 7B are cross-sectional views of the semiconductor memory device 1, which illustrate the steps from the step of exposing the second semiconductor layer 201 to the step of forming the bit line 500.

The second gate insulating layer 210 is removed by a dry etching method, so that the second semiconductor layer 201 is exposed (FIG. 7A).

Next, the insulating film 251 is formed. Next, a conduction hole for electrically connecting the source and drain regions 130 of the first transistor 100 to the bit line 500 is formed, and the hole is filled with the conductive layer 600. For example, the hole may be filled with aluminum, tungsten, copper, polysilicon, or the like.

Next, the bit line 500 is Banned (FIG. 7B).

Through the above steps, the semiconductor memory device 1 can be manufactured.

In the semiconductor memory device, the first gate electrode functions as a source electrode or a drain electrode of the second transistor, and the second semiconductor layer is formed so as to overlap with the first gate electrode. Thus, the source electrode and the drain electrode of the second transistor are formed vertically to a substrate over which the transistors are formed, with the second semiconductor layer located between the source electrode and the drain electrode. Accordingly, the area occupied by the second transistor can be made smaller than that occupied by a planar transistor, for example. Therefore, a semiconductor memory device having a high degree of integration can be provided.

Since the first gate electrode of the first transistor is used as the one capacitor electrode of the capacitor, the area occupied by the capacitor can be small. As a result, a semiconductor memory device having a high degree of integration can be provided.

Embodiment 5

In this embodiment, a method for manufacturing a semiconductor memory device, which is one embodiment of the present invention, is described.

Figure 2C:
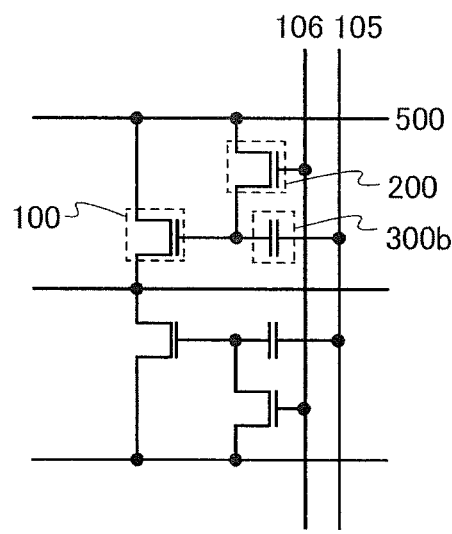

Hereinafter, steps for manufacturing the semiconductor memory device 2 illustrated in FIGS. 2A to 2C are described with reference to FIGS. 8A to 8E, FIGS. 9A to 9C, FIGS. 10A to 10C, and FIGS. 11A to 11C. The cross-sectional views along dashed dotted line A2-B2 of the top view of the semiconductor memory device 2 illustrate states after the respective steps. Top views illustrating states after the respective steps are not illustrated. No that in this embodiment, the case where single crystal silicon is used for the substrate is described. Embodiments 1 to 4 can be referred to for materials that can be used for components described below.

FIGS. 8A to 8E illustrate cross sections of the semiconductor memory device 2 on which the steps from the step of forming the first gate electrode 120 through the step of doping the source region and the drain region with an impurity to the step of forming the conductive layer 600*b*.

Figure 8A:
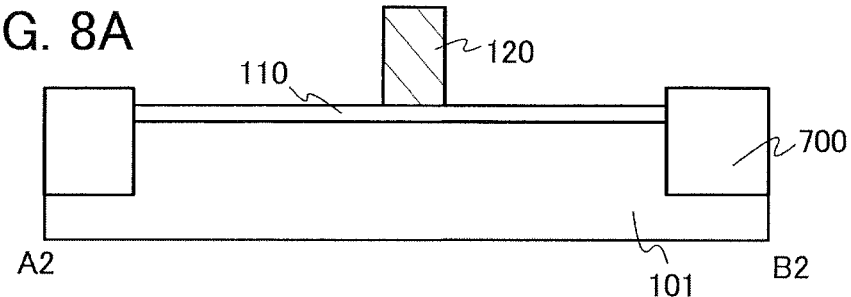
FIGS. 8A to 8E are cross-sectional views each illustrating a manufacturing step of the semiconductor memory device according to one embodiment of the present invention.

Embodiment 4 can be referred to for the steps to the step of forming the first gate electrode 120 (FIG. 8A).

Figure 8B:
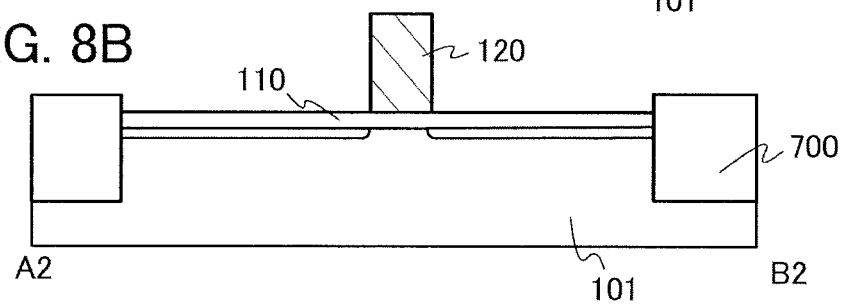

After the first gate electrode 120 is formed, a region where the sidewall layer 140 is to be formed is doped with an impurity so that the region has an electrical resistance lower than that of the channel region and higher than that of the source and drain regions. The kind of impurity with which the regions are doped may be selected depending on a desired conductive type for the first transistor 100 (FIG. 8B).

Figure 8C:
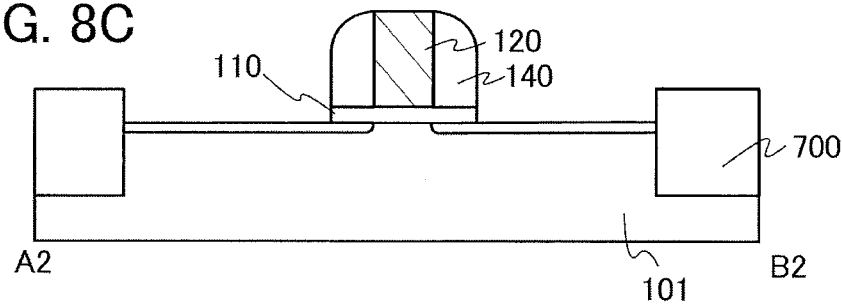

Next, the sidewall layer 140 is formed. The sidewall layer 140 may be formed in such a manner that a silicon oxide film or a silicon nitride film is formed so as to cover the first gate electrode 120, and anisotropic etching, i.e., etch back is performed on the surface of the film (FIG. 8C).

Figure 8D:
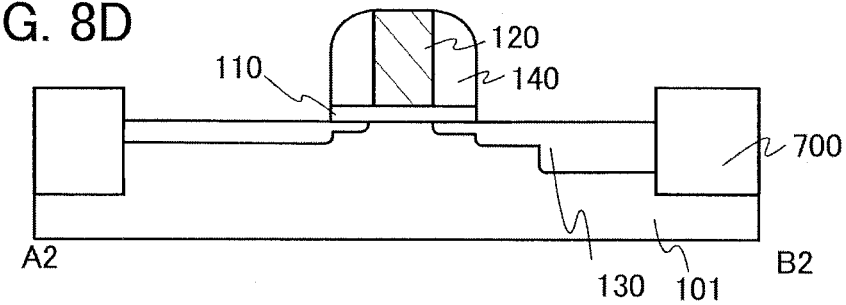

Next, regions where a source and a drain are to be formed are doped with an impurity, so that the source and drain regions 130 are formed. The injected impurity may be an impurity with which a transistor having a desirable conductivity type is formed in regions of silicon where the source and the drain are to be formed. The injection may be performed by an ion implantation method or the like (FIG. 8D).

Figure 8E:
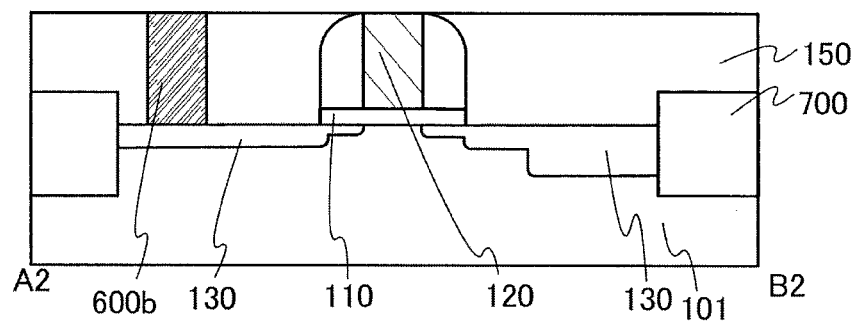

Next, the first interlayer film 150 is formed (FIG. 8E).

Next, a conduction hole for connecting one of the source and drain regions 130 of the first transistor 100 to the bit line 500 formed later is formed, and the hole is filled with the conductive layer 600*b*. For example, the hole may be filled with aluminum, tungsten, copper, polysilicon, or the like (FIG. 8E).

Figure 9A:
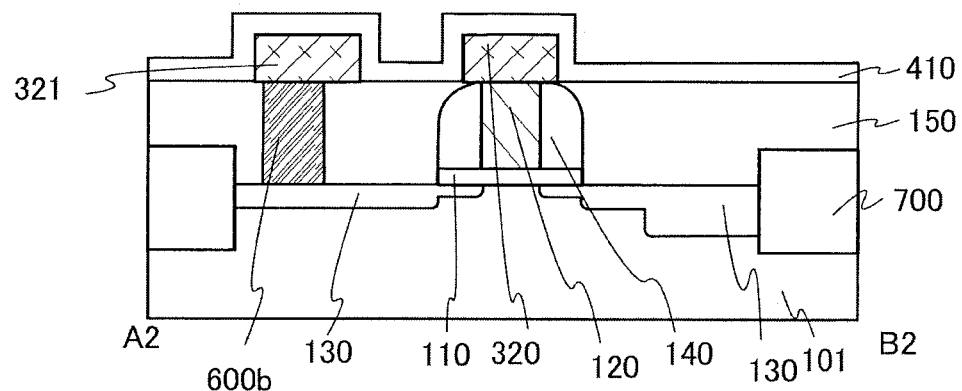
FIGS. 9A to 9C are cross-sectional views each illustrating a manufacturing step of the semiconductor memory device according to one embodiment of the present invention.
Figure 9B:
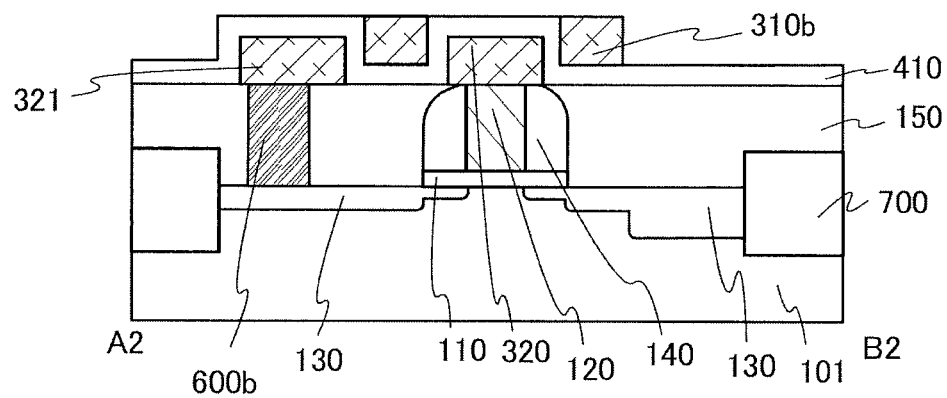
Figure 9C:
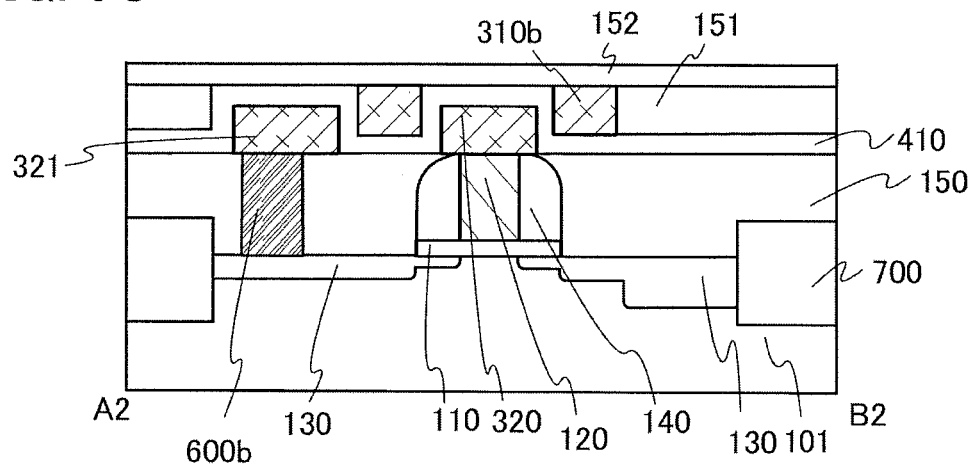

FIGS. 9A to 9C illustrate the steps from the step of forming the second capacitor electrode 320 to the step of forming an insulating layer 152.

The second capacitor electrode 320 is formed so as to be electrically connected to the first gate electrode 120. Further, a conductive layer 321 is formed so as to be electrically connected to the conductive layer 600*b*. The conductive layer 321 is preferably formed using the same material as the second capacitor electrode 320.

Next, the capacitor layer 410 is formed so as to be electrically connected to the second capacitor electrode 320 (FIG. 9A).

Next, the first capacitor electrode 310*b* is formed so as to be connected to the capacitor layer 410. The width and the thickness of the first capacitor electrode 310*b* can be determined based on the needed capacitance of the capacitor 300*b* (FIG. 9B).

Next, an insulating layer 151 and the insulating layer 152 are formed. The insulating layers 151 and 152 are formed using insulators. For example, for the insulating layers 151 and 152, silicon oxide, silicon oxynitride, silicon nitride, aluminum oxide, or the like can be used. In the steps, a surface of at least one of the insulating layers 151 and 152 are preferably planarized (FIG. 9C).

FIGS. 10A to 10C are the cross-sectional views illustrating the steps from the step of forming the second interlayer film 250 to the step of forming the second gate insulating layer 210.

First, the second interlayer film 250 is formed, and an opening is formed in a region of the second interlayer film 250 where the second gate electrode 220 is to be formed (FIG. 10A). The opening is preferably formed by dry etching.

Next, the second gate electrode 220 is formed (FIG. 10B).

Next, an opening is formed in a region of the second interlayer film 250 where the second semiconductor layer 201 is to be formed. Accordingly, a surface of the second capacitor electrode 320 is exposed. A sidewall of the opening is to be a gate insulating layer of the second transistor 200. Thus, after the opening is formed, the second gate insulating layer 210 is preferably formed on the sidewall of the opening (FIG. 10C). The second gate insulating layer 210 can be formed by a CVD method, a sputtering method, or the like.

FIGS. 11A to 11C are cross-sectional views illustrating the steps from the step of forming the second semiconductor layer 201 to the step of forming the bit line 500.

The second semiconductor layer 201 is formed so as to be electrically connected to the second capacitor electrode 320. In particular, the second semiconductor layer 201 is preferably formed using an oxide semiconductor. The oxide semiconductor film can be formed by a sputtering method, for example (FIG. 11A).

Next, the insulating film 251 is formed and then, a region of the insulating film 251 which overlaps with the second semiconductor layer 201 is removed by etching. At this time, an opening is preferably formed in a region of the insulating film 251, the second interlayer film 250, and the insulating layers 151 and 152, which overlaps with the conductive layer 321 (FIG. 11B).

Next, the conductive layer 600a is formed so as to be electrically connected to the conductive layer 321. Further, the bit line 500 is formed so as to be electrically connected to the second semiconductor layer 201.

Through the above steps, the semiconductor memory device 2 can be manufactured.

In the semiconductor memory device, the first gate electrode functions as a source electrode or a drain electrode of the second transistor, and the second semiconductor layer is formed so as to overlap with the first gate electrode. Thus, the source electrode and the drain electrode of the second transistor are formed vertically to a substrate over which the transistors are formed with the second semiconductor layer interposed therebetween. Accordingly, the area occupied by the second transistor can be made smaller than that occupied by a planar transistor, for example. Therefore, a semiconductor memory device having a high degree of integration can be provided.

Since the second capacitor electrode 320 and the first capacitor electrode 310b are used as the capacitor electrodes of the capacitor 300b, the area occupied by the capacitor can be small. As a result, a semiconductor memory device having a high degree of integration can be provided.

Embodiment 6

In this embodiment, a CAAC-OS film which can be used for an oxide semiconductor film, which is described in Embodiments 1 to 5, is described.

Note that in most cases, a crystal part in the CAAC-OS film fits inside a cube whose one side is less than 100 nm. In an image obtained with a transmission electron microscope (TEM), a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

An example of a crystal structure of the CAAC-OS film is described in details with reference to FIGS. 12A to 12E, FIGS. 13A to 13C, FIGS. 14A to 14C, and FIGS. 15A and 15B. In FIGS. 12A to 12E, FIGS. 13A to 13C, FIGS. 14A to 14C, and FIGS. 15A and 15B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
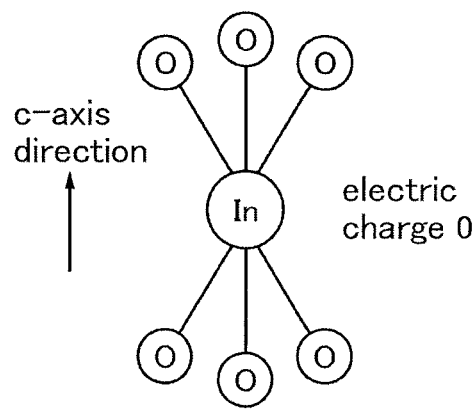
FIGS. 12A to 12E illustrate structures of oxide materials according to one embodiment of the present invention.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
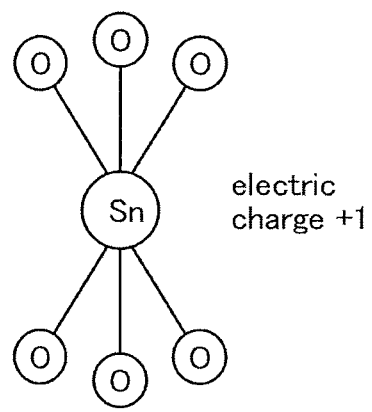
Figure 12B:
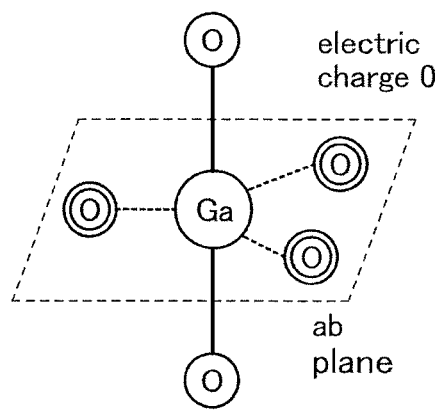

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
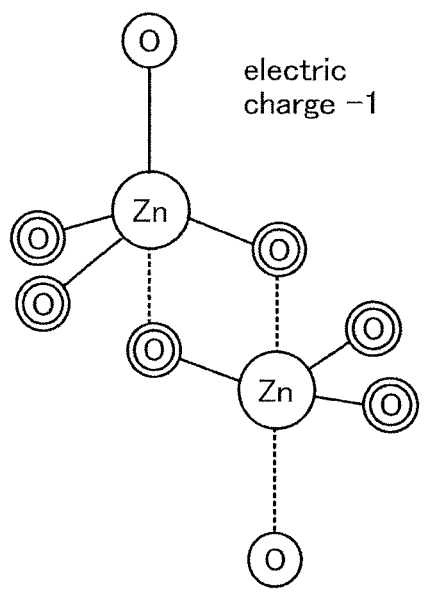
Figure 12C:
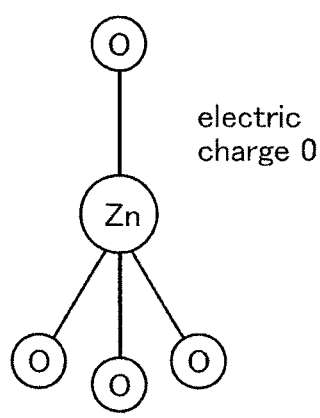

FIG. 12C illustrates a structure including one tetracoordinate Zn atom and four tetracoordinate O atoms proximate to the Zn atom. Three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups forms a medium group, and a plurality of medium groups forms a large group.

Now, a rule of bonding between the small groups is described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one 0 atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the stacked structure is 0.

Figure 13A:
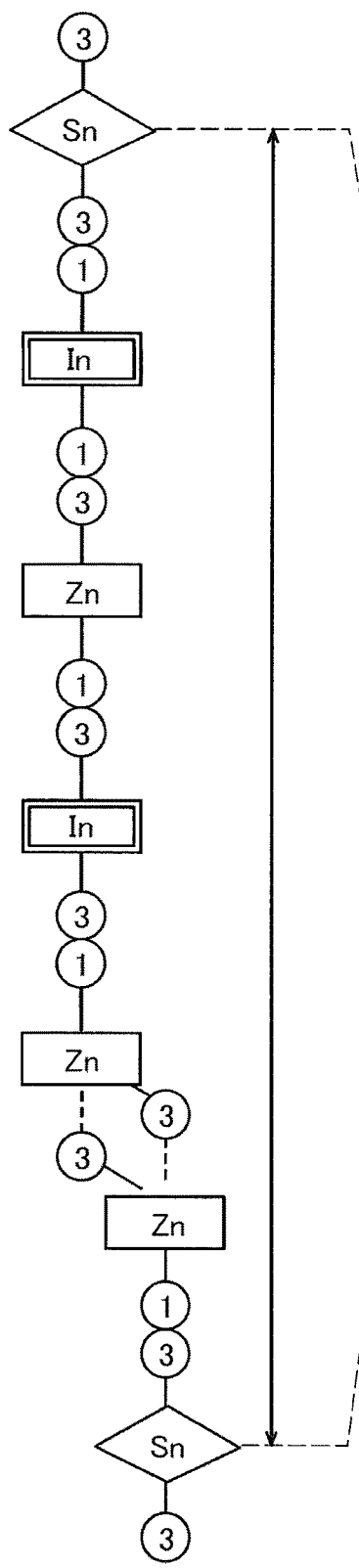
FIGS. 13A to 13C illustrate a structure of an oxide material according to one embodiment of the present invention.
Figure 13B:
Figure 13C:
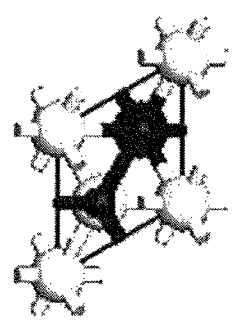

FIG. 13A illustrates a model of a medium group included in a stacked structure of an In—Sn—Zn-based oxide. FIG. 13B illustrates a large group including three medium groups. Note that FIG. 13C illustrates an atomic arrangement in the case where the stacked structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the stacked structure of the In—Sn—Zn-based oxide in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a stacked structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the stacked structure can be 0.

When the large group illustrated in FIG. 13B is repeated, an In—Sn—Zn-based oxide crystal ($In_2SnZn_3O_8$) can be obtained. Note that a stacked structure of the obtained In—Sn—Zn-based oxide can be expressed as a composition formula, $In_2SnZn_2O_7(ZnO)_m$ (m is 0 or a natural number). As larger m is, the crystallinity of the In—Sn—Zn—O-based crystal is improved, which is preferable.

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 14A:
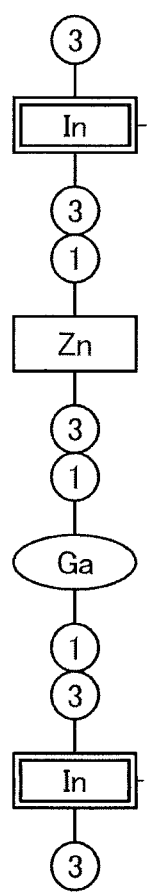
FIGS. 14A to 14C illustrate a structure of an oxide material according to one embodiment of the present invention.

As an example, FIG. 14A illustrates a model of a medium group included in a stacked structure of an In—Ga—Zn-based oxide.

In the medium group included in the stacked structure of the In—Ga—Zn-based oxide in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 14B:
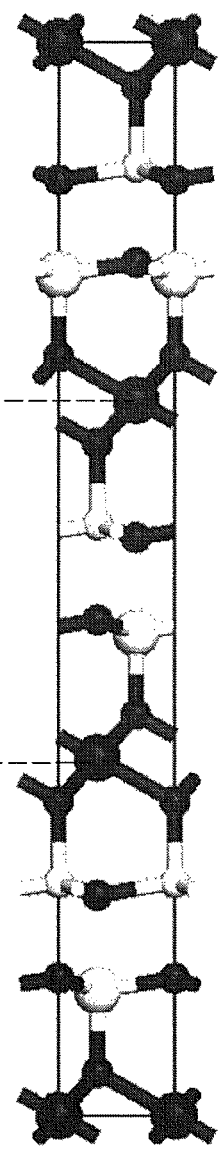
Figure 14C:
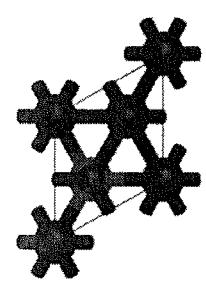

FIG. 14B illustrates a large group including three medium groups. Note that FIG. 14C illustrates an atomic arrangement in the case where the stacked structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the stacked structure of the In—Ga—Zn-based material, a large group can be formed using not only the medium group illustrated in FIG. 14A but also a medium group in which the arrangement of the In atom, the Ga atom, and the Zn atom is different from that in FIG. 14A.

When the large group illustrated in FIG. 14B is repeated, a crystal of an In—Ga—Zn-based material can be obtained. Note that a stacked structure of the obtained In—Ga—Zn-based material can be expressed as a composition formula, $InGaO_3(ZnO)_n$ (n is a natural number).

Figure 15A:
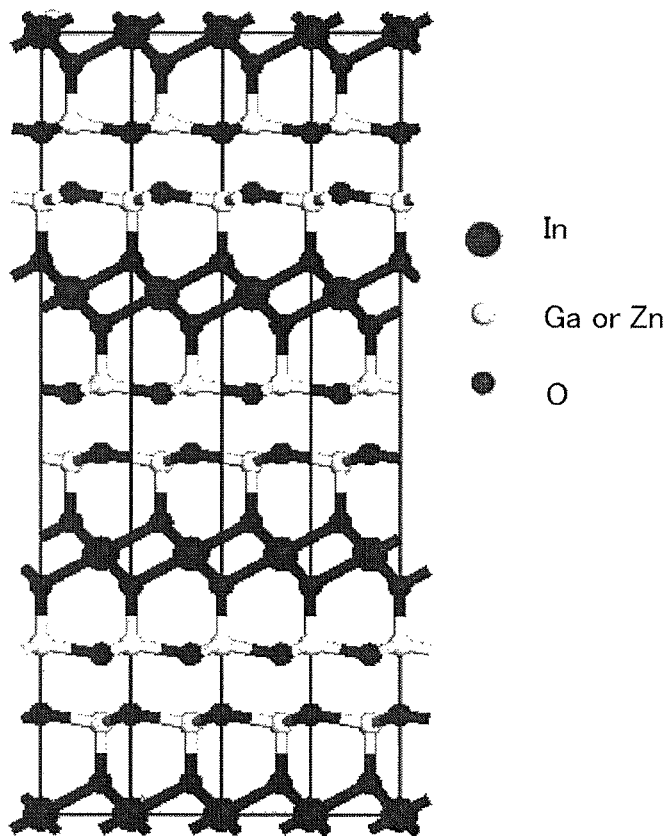
FIGS. 15A and 15B each illustrate a crystal structure of an oxide material according to one embodiment of the present invention.

In the case where n=1 ($InGaZnO_4$), a crystal structure illustrated in FIG. 15A can be obtained, for example. Note that in the crystal structure in FIG. 15A, since a Ga atom and an In atom each have five ligands as illustrated in FIG. 12B, a structure in which Ga is replaced with In can be obtained.

Figure 15B:
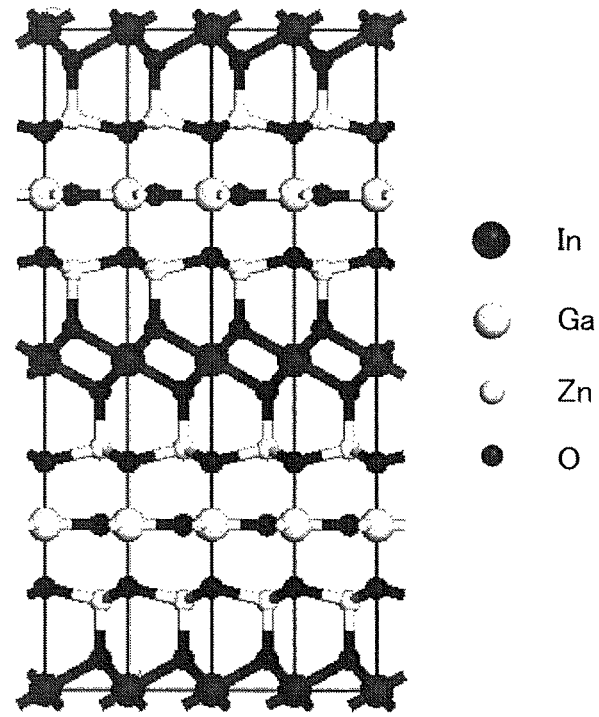

In the case where n=2 ($InGaZn_2O_5$), a crystal structure illustrated in FIG. 15B can be obtained, for example. Note that in the crystal structure in FIG. 15B, since a Ga atom and an In atom each have five ligands as described in FIG. 12B, a structure in which Ga is replaced with In can be obtained.

Embodiment 7

In this embodiment, a configuration example of a semiconductor memory device of an embodiment of the present invention is described with reference to FIG. 16.

Figure 16:
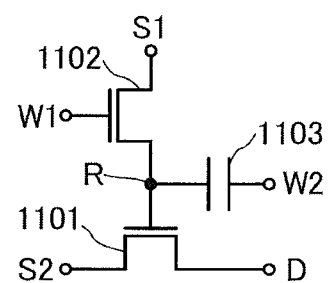
FIG. 16 is a circuit diagram of a main portion of a semiconductor memory device of one embodiment of the present invention.

FIG. 16 is a circuit diagram of a main portion of the semiconductor memory device of an embodiment of the present invention. The semiconductor memory device includes a first transistor 1101, a second transistor 1102, and a capacitor 1103.

The semiconductor memory device includes a node (holding node R) to which a gate of the first transistor 1101, a first electrode of the second transistor 1102, and one electrode of the capacitor 1103 are electrically connected.

Further, a wiring S2 is electrically connected to a first electrode of the first transistor 1101 and a wiring D is electrically connected to a second electrode of the first transistor 1101. A wiring W1 is connected to a gate of the second transistor 1102 and a wiring S1 is electrically connected to a second electrode of the second transistor 1102. A wiring W2 is electrically connected to the other electrode of the capacitor 1103.

When data is written to the semiconductor memory device, a potential for turning on the second transistor 1102 is input to the wiring W1 and a predetermined potential is input to the second electrode of the second transistor 1102 from the wiring S1, so that the predetermined potential can be written to the holding node R. After that, a potential for turning off the second transistor 1102 is input to the wiring W1, so that the potential is held in the holding node R.

Further, the first transistor 1101 whose gate electrode is connected to the holding node R is in an on state or an off state depending on a potential held in the holding node R. Therefore, data can be read by inputting a potential for reading data to one of the wiring S2 and the wiring D and detecting a potential of the other.

Thus, when data is written to or erased from the semiconductor memory device of an embodiment of the present invention, only voltage for turning on the second transistor 1102 is needed. Further, as voltage needed for writing data to the holding node R, only voltage for controlling an on state and an off state of the first transistor 1101 is needed. Accordingly, unlike a flash memory, the semiconductor memory device of an embodiment of the present invention does not need high voltage in driving, whereby power consumption of the semiconductor memory device can be significantly reduced.

As the second transistor 1102, a transistor with reduced leakage current in an off state (off-state current) compared to a transistor including silicon for a semiconductor where a channel is formed is preferably used. Specifically, a transistor including a semiconductor whose band gap is wider than that of silicon as a semiconductor where a channel is formed is used. A compound semiconductor is an example of the semiconductor whose band gap is wider than that of silicon. Examples of the compound semiconductor include an oxide semiconductor, a nitride semiconductor, and the like.

In particular, an oxide semiconductor is preferably used as the semiconductor where the channel of the second transistor 1102 is formed.

In this manner, with the use of a transistor with reduced off-state current as the second transistor 1102, a semiconductor memory device which can hold stored data even when power is not supplied can be obtained.

Embodiment 8

In this embodiment, a central processing unit (CPU), which is an example of a semiconductor device, at least part of which includes any of the semiconductor memory devices described in the above embodiments is described.

Figure 17A:
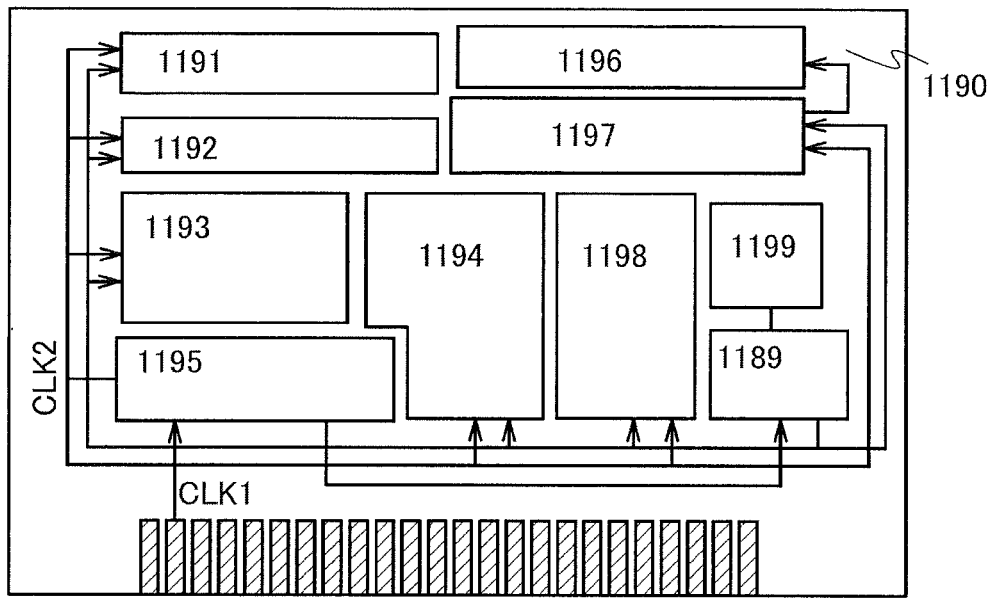
FIGS. 17A to 17C illustrate a semiconductor device of one embodiment of the present invention.

FIG. 17A is a block diagram illustrating a specific structure of a CPU. The CPU illustrated in FIG. 17A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Obviously, the CPU illustrated in FIG. 17A is only an example in which the structure is simplified, and a variety of structures is applied to an actual CPU depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 17A, a memory cell is provided in the register 1196. The memory cell in the register 1196 includes both a logic element which inverts a logic (logical value) and any of the semiconductor memory devices described in the above embodiments.

In the CPU illustrated in FIG. 17A, the register controller 1197 selects operation of holding data in the register 1196 in accordance with an instruction from the ALU 1191. That is, the register controller 1197 selects whether data is held by the logic element which inverts a logic (logical value) or the semiconductor memory device in the memory cell included in the register 1196. When data holding by the logic element which inverts a logic (logical value) is selected, power supply voltage is supplied to the memory cell in the register 1196. When data holding by the semiconductor memory device is selected, the data is rewritten to the semiconductor memory device, and supply of power supply voltage to the memory cell in the register 1196 can be stopped.

Figure 17B:
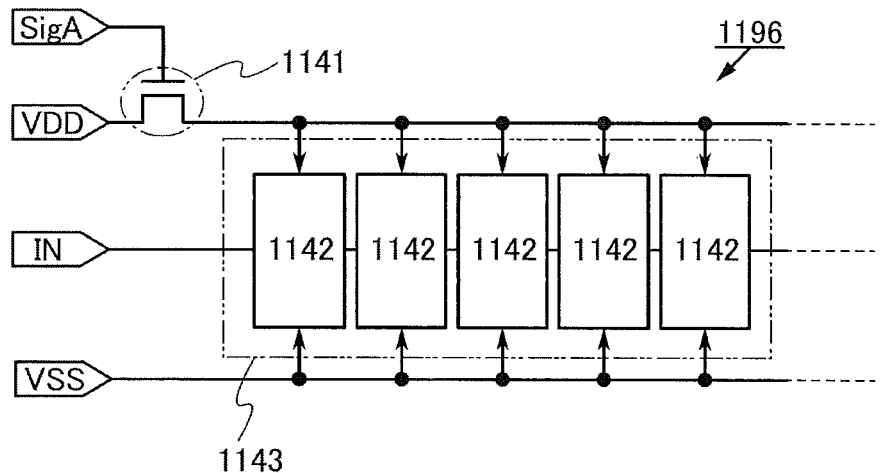
Figure 17C:
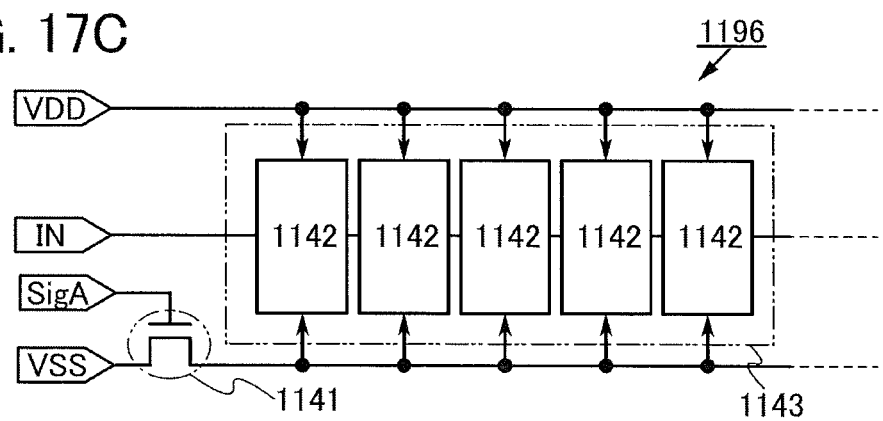

The supply of power can be stopped with a switching element provided between a memory cell group and a node to which a power supply potential VDD or a power supply potential VSS is supplied, as illustrated in FIG. 17B or FIG. 17C. Circuits illustrated in FIGS. 17B and 17C are described below.

In each of FIGS. 17B and 17C, the register 1196 includes a switching element which controls supply of power supply voltage to a memory cell.

The register 1196 illustrated in FIG. 17B includes a switching element 1141 and a memory cell group 1143 including a plurality of memory cells 1142. Specifically, each of the memory cells 1142 includes both a logic element which inverts a logic (logical value) and any of the above semiconductor memory devices. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 17B, a transistor is used as the switching element 1141, and the switching of the transistor is controlled by a signal Sig A supplied to a gate electrode thereof.

FIG. 17B illustrates the structure in which the switching element 1141 includes only one transistor. Note that the structure is not limited and the switching element 1141 may include a plurality of transistors. In the case where the switching element 1141 includes a plurality of transistors which serve as switching elements, the plurality of transistors may be connected to each other in parallel, in series, or in combination of parallel connection and series connection.

In FIG. 17C, an example of the register 1196 in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that power consumption can be reduced.

Further, an electronic device including such a CPU consumes less power; therefore, the electronic device can sufficiently operate with relatively low power obtained from a solar battery or contactless power feeding (wireless feeding), for example. For example, an electronic device may include a solar battery module or a contactless power feeding module, and a secondary battery (e.g., a lithium ion battery) storing power obtained from the module.

Although the CPU is given as an example, the semiconductor memory device can also be applied to an LSI such as a digital signal processor (DSP), a custom LSI, or a field programmable gate array (FPGA).

Embodiment 9

A semiconductor memory device disclosed in this specification can be applied to a variety of electronic devices (including game machines). Specific examples of electronic devices are as follows: display devices such as televisions and monitors, lighting devices, desktop or laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as still cameras and video cameras, electric shavers, high-frequency heating devices such as microwave ovens, electric rice cookers, electric washing machines, electric vacuum cleaners, air-conditioning systems such air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. The examples also include industrial equipment such as guide lights, traffic lights, belt conveyors, elevators, escalators, industrial robots, and power storage systems. In addition, moving objects driven by oil engines or motors using power from non-aqueous secondary batteries are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts. Specific examples of such electronic devices are illustrated in FIGS. 18A and 18B and FIGS. 19A to 19C.

Figure 18A:
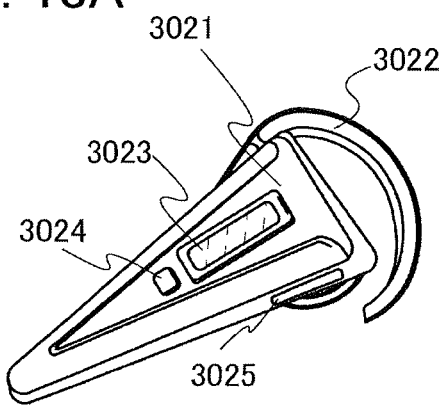
FIGS. 18A and 18B illustrate electronic devices according to embodiments of the present invention.

FIG. 18A illustrates a portable music player, which includes, in a main body 3021, a display portion 3023, a fixing portion 3022 with which the main body is worn on the ear, a speaker, an operation button 3024, an external memory slot 3025, and the like. Any of the semiconductor memory devices or any of the semiconductor devices described in the above embodiments is applied to a memory, a CPU, or the like included in the main body 3021, whereby a portable music player (PDA) whose power consumption is reduced can be provided.

Furthermore, when the portable music player illustrated in FIG. 18A has an antenna, a microphone function, or a wireless communication function and is used with a mobile phone, a user can talk on the phone wirelessly in a hands-free way while driving a car or the like.

Figure 18B:
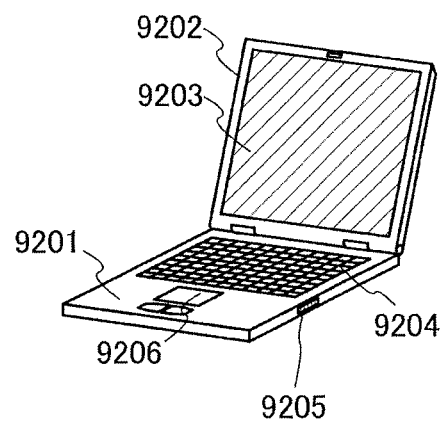

FIG. 18B illustrates a computer, which includes a main body 9201 including a CPU, a housing 9202, a display portion 9203, a keyboard 9204, an external connection port 9205, a pointing device 9206, and the like. With the use of any of the semiconductor devices described in the above embodiments, such as the semiconductor memory device and the CPU, power consumption of the computer can be reduced.

Figure 19A:
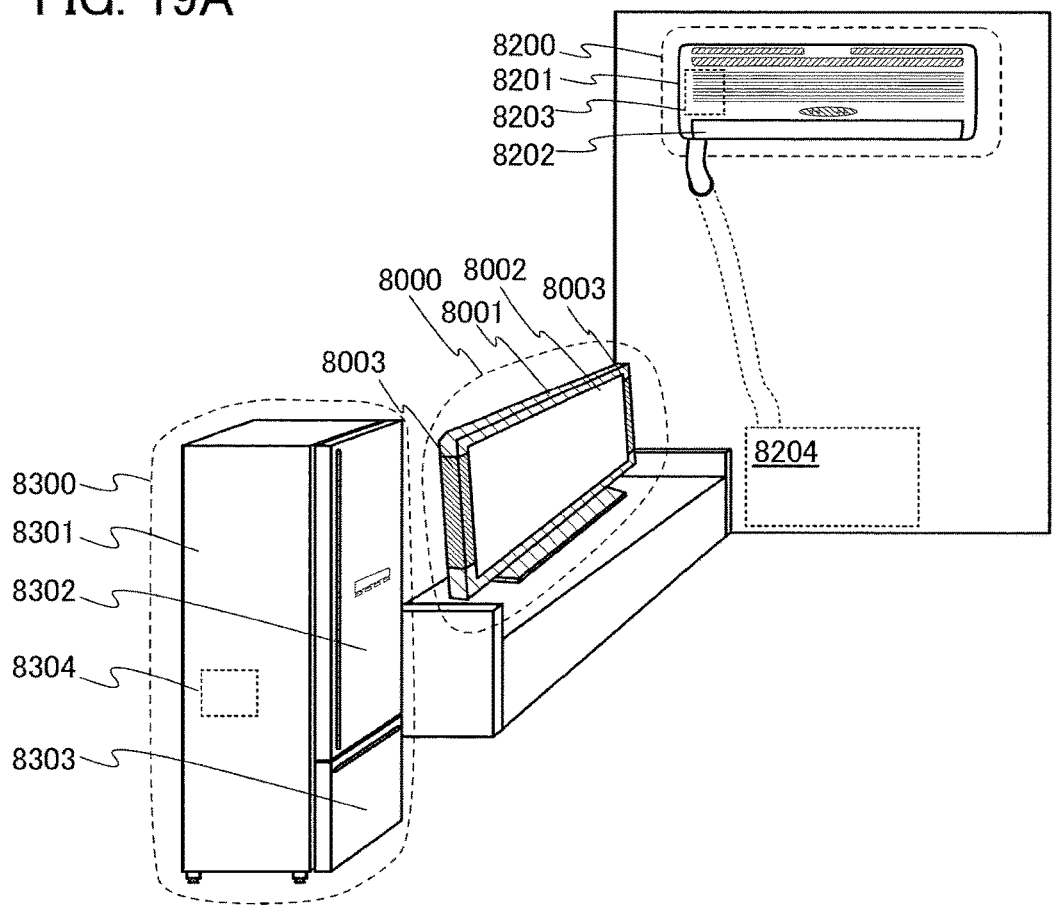
FIGS. 19A to 19C illustrate electronic devices according to embodiments of the present invention.

In a television set 8000 in FIG. 19A, a display portion 8002 is incorporated in a housing 8001. The display portion 8002 can display an image and a speaker portion 8003 can output sound. Any of the semiconductor memory devices or any of the semiconductor devices described in the above embodiments can be used for a driver circuit for operating the display portion 8002 incorporated in the housing 8001.

A semiconductor display device such as a liquid crystal display device, a light-emitting device in which a light-emitting element such as an organic EL element is provided in each pixel, an electrophoretic display device, a digital micromirror device (DMD), or a plasma display panel (PDP) can be used for the display portion 8002.

The television set 8000 may be provided with a receiver, a modem, and the like. With the receiver, the television set 8000 can receive a general television broadcast. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The semiconductor device such as the semiconductor memory device or the CPU described in the above embodiments can be used for the television set 8000.

In FIG. 19A, an air conditioner which includes an indoor unit 8200 and an outdoor unit 8204 is an example of an electronic device in which a semiconductor device such as the CPU described in the above embodiment is used. Specifically, the indoor unit 8200 includes a housing 8201, an air outlet 8202, a CPU 8203, and the like. Although the CPU 8203 is provided in the indoor unit 8200 in FIG. 19A, the CPU 8203 may be provided in the outdoor unit 8204. Alternatively, the CPU 8203 may be provided in both the indoor unit 8200 and the outdoor unit 8204. With the CPU described in the above embodiment, an air conditioner which is excellent in power saving can be provided.

In FIG. 19A, an electric refrigerator-freezer 8300 is an example of an electronic device which is provided with a semiconductor device such as the CPU described in the above embodiment. Specifically, the electric refrigerator-freezer 8300 includes a housing 8301, a door for a refrigerator 8302, a door for a freezer 8303, a CPU 8304, and the like. In FIG. 19A, the CPU 8304 is provided in the housing 8301. When a semiconductor device such as the CPU described in the above embodiment is used as the CPU 8304 of the electric refrigerator-freezer 8300, power saving can be achieved.

Figure 19B:
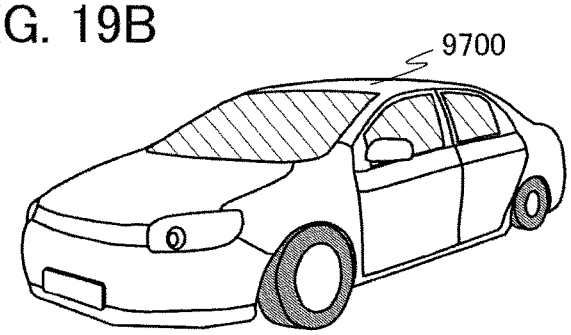
Figure 19C:
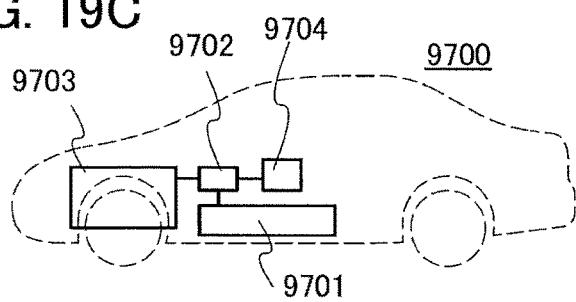

FIGS. 19B and 19C illustrate an example of an electric vehicle which is an example of an electronic device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the semiconductor devices described in the above embodiment, such as the semiconductor memory device or the CPU, is used in the processing unit 9704 in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments disclosed in this specification as appropriate.

This application is based on Japanese Patent Application serial No. 2012-048244 filed with Japan Patent Office on Mar. 5, 2012, the entire contents of which are hereby incorporated by reference.

What is claimed is:

1. A manufacturing method of a semiconductor device comprising:
    forming a transistor comprises a gate electrode;
    forming a cylindrical semiconductor consisting of an oxide semiconductor on and in contact with the gate electrode;
    forming a gate insulating film covering a side surface and a top surface of the cylindrical semiconductor; and
    forming a first conductor covering the side surface of the cylindrical semiconductor with the gate insulating film therebetween.

2. The manufacturing method according to claim 1, wherein the oxide semiconductor comprises indium, gallium and zinc.

3. The manufacturing method according to claim 1, wherein the first conductor is formed over a second conductor with the gate insulating film therebetween.

4. The manufacturing method according to claim 1, wherein a side surface of the first conductor is in contact with an insulator that is on and in contact with the gate insulating film.

5. The manufacturing method according to claim 1, further comprising:
   removing a portion of the gate insulating film that covers the top surface of the cylindrical semiconductor, and
   forming a second conductor on and in contact with the cylindrical semiconductor.

6. A manufacturing method of a semiconductor device comprising:
   forming a transistor comprises a gate electrode;
   forming a columnar semiconductor consisting of an oxide semiconductor on and in contact with the gate electrode;
   forming a gate insulating film covering a side surface and a top surface of the columnar semiconductor; and
   forming a first conductor covering the side surface of the columnar semiconductor with the gate insulating film therebetween.

7. The manufacturing method according to claim 6, wherein the oxide semiconductor comprises indium, gallium and zinc.

8. The manufacturing method according to claim 6, wherein the first conductor is formed over a second conductor with the gate insulating film therebetween.

9. The manufacturing method according to claim 6, wherein a side surface of the first conductor is in contact with an insulator that is on and in contact with the gate insulating film.

10. The manufacturing method according to claim 6, further comprising:
    removing a portion of the gate insulating film that covers the top surface of the columnar semiconductor, and
    forming a second conductor on and in contact with the columnar semiconductor.

* * * * *